United States Patent
Kim et al.

(10) Patent No.: US 10,923,544 B2
(45) Date of Patent: Feb. 16, 2021

(54) DISPLAY DEVICE HAVING FIRST LIGHT EMITTING ELEMENT IN A NON-TRANSMISSION PORTION AND A SECOND LIGHT EMITTING ELEMENT IN A TRANSMISSION PORTION

(71) Applicant: LG Display Co., Ltd., Seoul (KR)

(72) Inventors: Euitae Kim, Paju-si (KR); Dahye Shim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/708,219

(22) Filed: Dec. 9, 2019

(65) Prior Publication Data

US 2020/0203453 A1 Jun. 25, 2020

(30) Foreign Application Priority Data

Dec. 20, 2018 (KR) .......................... 10-2018-0166706

(51) Int. Cl.
| | | |
|---|---|---|
| H01L 27/32 | (2006.01) |
| G09G 3/3225 | (2016.01) |
| H05K 1/18 | (2006.01) |
| H01L 51/52 | (2006.01) |

(52) U.S. Cl.
CPC ....... *H01L 27/3248* (2013.01); *G09G 3/3225* (2013.01); *H01L 27/3211* (2013.01); *H01L 27/3246* (2013.01); *H01L 27/3276* (2013.01); *H01L 51/5284* (2013.01); *H05K 1/18* (2013.01); *H05K 2201/10128* (2013.01)

(58) Field of Classification Search
CPC ............ H01L 27/3248; H01L 27/3211; H01L 27/3276; H01L 51/5284; H01L 27/3286; G09G 3/3225; H05K 1/18
See application file for complete search history.

(56) References Cited

U.S. PATENT DOCUMENTS

| | | | |
|---|---|---|---|
| 2004/0245531 A1* | 12/2004 | Fuii ...................... H01L 27/156 257/88 |
| 2005/0258744 A1* | 11/2005 | Kwak .................. G09G 3/3233 313/504 |
| 2016/0035807 A1* | 2/2016 | Shi ...................... H01L 51/0512 257/40 |
| 2017/0125744 A1* | 5/2017 | Kim ................... H01L 51/0096 |
| 2018/0081756 A1* | 3/2018 | Akasawa ............ H01L 27/3262 |
| 2018/0190735 A1* | 7/2018 | Son ................... G02F 1/133512 |
| 2018/0190748 A1* | 7/2018 | Im ........................ H01L 27/322 |
| 2019/0081122 A1* | 3/2019 | Kim .................... H01L 51/5253 |

FOREIGN PATENT DOCUMENTS

| | | |
|---|---|---|
| KR | 10-2007-0043255 A | 4/2007 |
| KR | 10-2015-0054384 A | 5/2015 |

* cited by examiner

*Primary Examiner* — Michael Jung
(74) *Attorney, Agent, or Firm* — Fenwick & West LLP

(57) ABSTRACT

A display device includes a first substrate including a circuit portion and a transmission portion, a first organic light emitting diode disposed over one surface of the first substrate and overlapping with the circuit portion, a second organic light emitting diode disposed over the other surface of the first substrate and overlapping with the transmission portion, and a second substrate facing one surface of the first substrate, in which the first organic light emitting diode and the second organic light emitting diode emit light to the second substrate.

17 Claims, 18 Drawing Sheets

| | Comparative Example | Embodiment |
|---|---|---|
| Image | | |
| Transmittance | 47% | 59% |
| Haze | 6% | 2% |
| Purity | 41% | 63% |

DISPLAY DEVICE HAVING FIRST LIGHT EMITTING ELEMENT IN A NON-TRANSMISSION PORTION AND A SECOND LIGHT EMITTING ELEMENT IN A TRANSMISSION PORTION

This application claims the priority benefit of Republic of Korea Patent Application No. 10-2018-0166706 filed on Dec. 20, 2018, which is incorporated herein by reference for all purposes as if fully set forth herein.

BACKGROUND

Field

The present disclosure relates to a display device, and more particularly, to a display device capable of improving an aperture ratio and a transmittance and reducing manufacturing cost.

Related Art

With the development of information society, the demand for display devices for displaying images is increasing in various forms. The display field has rapidly changed to a flat panel display device (FPD) which is thin and light and has a large area instead of a cathode ray tube (CRT) having a large volume. The FPD includes a liquid crystal display device (LCD), a plasma display panel (PDP), an organic light emitting display device (OLED), and an electrophoretic display device (ED).

Among them, the OLED is a self-emission device of self-emitting light, which has an advantage of high response rate and high luminous efficiency, brightness, and viewing angle. Particularly, the OLED may be formed even on a flexible substrate, can be driven at a lower voltage than a plasma display panel (PDP) or an inorganic electroluminescence (EL) display, and has an advantage of being relatively low in power consumption and excellent in color.

Recently, a transparent display device capable of being viewed through the rear surface from the front surface of the display device has been developed. For example, a transparent organic light emitting display device includes a sub-pixel that emits light and a transmission portion through which external light is transmitted, thereby realizing a transparent display device. There is a problem in that it is difficult to increase aperture ratios of the sub-pixel and the transmission portion due to a tradeoff relationship in which the transmission portion becomes smaller when the sub-pixel becomes larger, and the sub-pixel becomes smaller when the transmission portion becomes larger.

SUMMARY

The present disclosure provides a display device capable of increasing brightness and a lifetime, decreasing a haze, and improving color purity by increasing a light emitting portion.

The present disclosure provides a display device comprising a first substrate including a circuit portion and a transmission portion, a first organic light emitting diode disposed over one surface of the first substrate and overlapping with the circuit portion, a second organic light emitting diode disposed over the other surface of the first substrate and overlapping with the transmission portion, and a second substrate facing one surface of the first substrate in which the first organic light emitting diode and the second organic light emitting diode emit light to the second substrate.

The first organic light emitting diode may include a first driving transistor and the second organic light emitting diode may include a second driving transistor.

The first driving transistor and the second driving transistor may overlap with each other with the second substrate interposed therebetween.

The first organic light emitting diode may include a first lower electrode connected to the first driving transistor, a first organic layer disposed on the first lower electrode, and a first upper electrode disposed on the first organic layer, and the second organic light emitting diode may include a second lower electrode connected to the second driving transistor, a second organic layer disposed on the second lower electrode, and a second upper electrode disposed on the second organic layer.

The first lower electrode may be a reflection electrode and the second lower electrode may be a transmission electrode.

The first lower electrode may overlap with the circuit portion and the second lower electrode may overlap with the transmission portion.

The first organic light emitting diode may emit at least two light of red, green, and blue and the second organic light emitting diode may emit one remaining light of red, green, and blue except for the light emitted from the first organic light emitting diode.

The second organic light emitting diode may emit a single color of light.

The first organic light emitting diode may further include a first bank layer for partitioning the first lower electrode and the second organic light emitting diode may further include a second bank layer for partitioning the second lower electrode.

The display device may further comprise a black matrix disposed on one surface of the second substrate facing the first substrate, in which the first bank layer may have a width larger than the width of the black matrix and the second bank layer may have a width equal to or smaller than the width of the black matrix.

The display device may further comprise a first pad portion disposed over one surface of the first substrate, a first printed circuit board connected to the first pad portion through a first chip-on film, a second pad portion disposed over the other surface of the first substrate, and a second printed circuit board connected to the second pad portion through a second chip-on film, in which the first printed circuit board and the second printed circuit board may overlap with each other.

The display device may further comprise a first pad portion disposed over one surface of the first substrate, a first printed circuit board connected to the first pad portion through a first chip-on film, a second pad portion disposed over the other surface of the first substrate, and a second printed circuit board connected to the second pad portion through a second chip-on film, in which the first printed circuit board and the second printed circuit board may not overlap with each other.

Embodiments also relate to a display device including a plurality of sub-pixels. Each sub-pixel may include at least a part of a first substrate. The part of the first substrate may include a circuit portion and a transmission portion adjacent the circuit portion. The transmission portion is configured to transmit light. Each sub-pixel may also include a first light emitting element disposed over one surface of the first substrate in the circuit portion, a first driving transistor on the one surface of the first substrate in the circuit portion, the first driving transistor electrically connected to the first light emitting element, and a second light emitting element disposed over another surface of the first substrate in the transmission portion.

Embodiments also relate to a display device including a plurality of sub-pixels. Each sub-pixel may include at least a part of a first substrate. The part of the first substrate may include a non-transmission portion and a transmission portion adjacent the non-transparent portion. Each sub-pixel may also include a first light emitting element disposed on one surface of the first substrate in the non-transmission portion, and a second light emitting element disposed on another surface of the first substrate in the transmission portion.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF EXEMPLARY EMBODIMENTS

Figure 1:
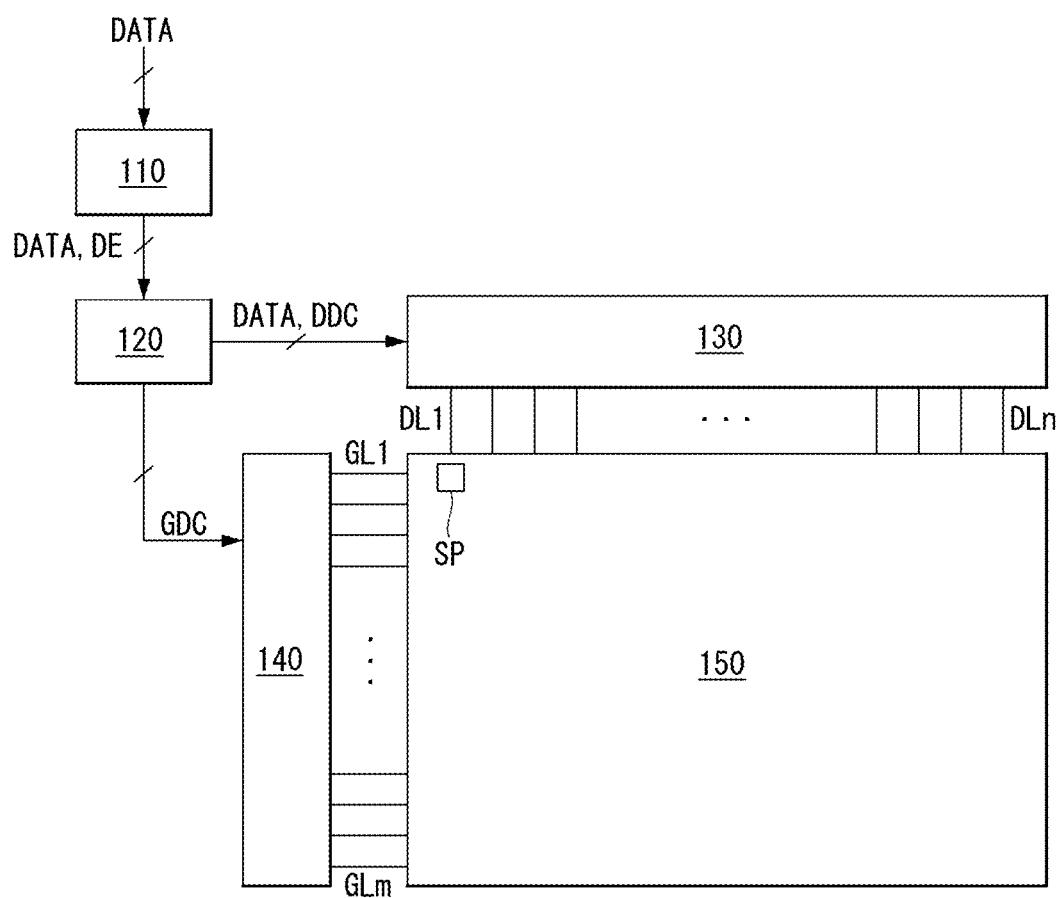
FIG. 1 is a schematic block diagram of an organic light emitting display device, according to an embodiment of the present disclosure.

Hereinafter, exemplary embodiments of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present invention. In addition, the component names used in the following description may be selected in consideration of easiness of specification, and may be different from the parts names of actual products.

A display device according to the present disclosure is a display device in which a display element is formed on a glass substrate or a flexible substrate. As an example of the display device, an organic light emitting display device, a liquid crystal display device, an electrophoretic display device, or the like can be used, but in the present disclosure, the organic light emitting display device will be described as an example. The organic light emitting display device includes an organic layer formed of an organic material between a first electrode which is an anode and a second electrode which is a cathode. Accordingly, the organic light emitting display device is a self-emission display device in which holes supplied from the first electrode and electrons supplied from the second electrode are combined in the organic layer to form excitons, which are hole-electron pairs, and light is emitted by energy generated when the excitons return to a ground state.

The display device according to the present disclosure is an organic light emitting display device having a top emission structure. The organic light emitting display device having the top emission structure has a structure in which the light emitted from the light emitting layer is transmitted by passing through a transparent second electrode located at the upper side.

Hereinafter, exemplary embodiments of the present disclosure will be described with reference to the accompanying drawings.

Figure 2:
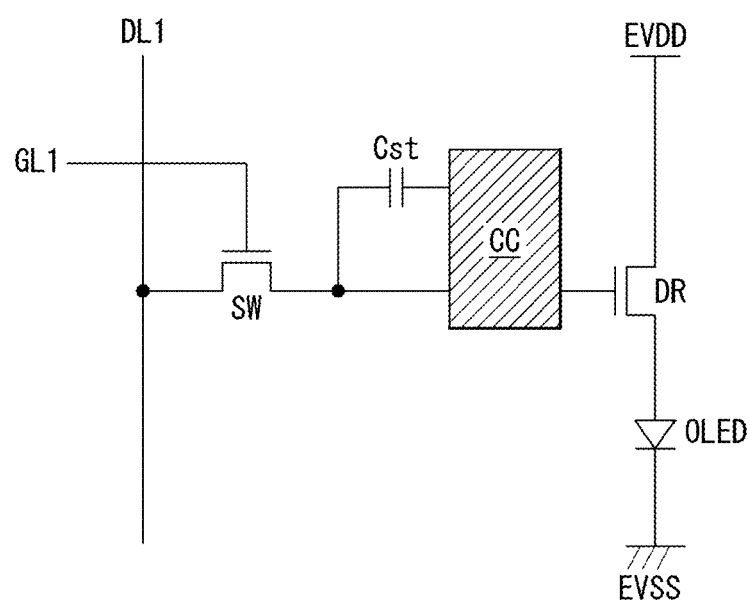
FIG. 2 is a schematic circuit configuration diagram of a sub-pixel, according to an embodiment of the present disclosure.
Figure 3:
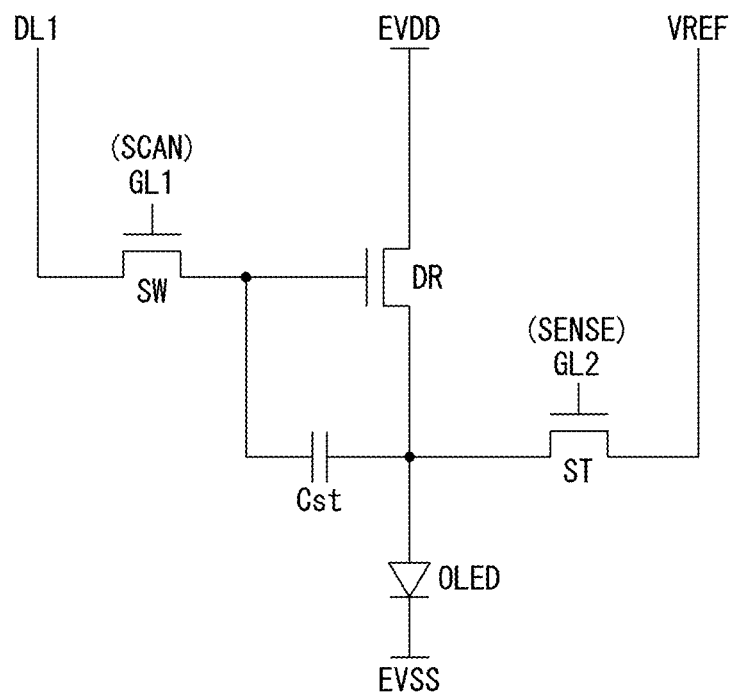
FIG. 3 is a diagram illustrating a detailed circuit configuration of a sub-pixel, according to an embodiment of the present disclosure.

FIG. 1 is a schematic block diagram of an organic light emitting display device, according to an embodiment of the present disclosure, FIG. 2 is a schematic circuit configuration diagram of a sub-pixel, according to an embodiment of the present disclosure, and FIG. 3 is a diagram illustrating a detailed circuit configuration of a sub-pixel, according to an embodiment of the present disclosure.

As illustrated in FIG. 1, an organic light emitting display device includes an image processor 110, a timing controller 120, a data driver 130, a scan driver 140, and a display panel 150.

The image processor 110 outputs a data enable signal DE and the like together with a data signal DATA supplied from the outside. The image processor 110 may output at least one of a vertical synchronization signal, a horizontal synchronization signal, and a clock signal in addition to the data enable signal DE, but these signals will be not illustrated for convenience of description.

The timing controller 120 receives a data signal DATA from the image processor 110 in addition to the data enable signal DE or a driving signal including the vertical synchronization signal, the horizontal synchronization signal, and the clock signal. The timing controller 120 outputs a gate timing control signal GDC for controlling an operation timing of the scan driver 140 and a data timing control signal DDC for controlling an operation timing of the data driver 130 based on the driving signal.

The data driver 130 samples and latches the data signal DATA supplied from the timing controller 120 in response to the data timing control signal DDC supplied from the timing controller 120 and converts and outputs the sampled and latched data signal into a gamma reference voltage. The data driver 130 outputs the data signal DATA through data lines DL1 to DLn. The data driver 130 may be formed in the form of an integrated circuit (IC).

The scan driver 140 outputs a scan signal in response to the gate timing control signal GDC supplied from the timing controller 120. The scan driver 140 outputs a scan signal through gate lines GL1 to GLm. The scan driver 140 is formed in the form of an integrated circuit (IC) or formed on the display panel 150 in a gate-in-panel form.

The display panel 150 displays an image in response to the data signal DATA and the scan signal supplied from the data driver 130 and the scan driver 140. The display panel 150 includes sub-pixels SPs that operate to display the image.

The sub-pixels SPs include red sub-pixels, green sub-pixels, and blue sub-pixels or include white sub-pixels, red sub-pixels, green sub-pixels, and blue sub-pixels. The sub-pixels SPs may have one or more different emission areas depending on emission characteristics.

As illustrated in FIG. 2, one sub-pixel includes a switching transistor SW, a driving transistor DR, a capacitor Cst, a compensation circuit CC, and an organic light emitting diode OLED.

The switching transistor SW operates switching so that the data signal supplied through the data line DL in response to the scan signal supplied through a first gate line GL1 is stored as a data voltage in the capacitor Cst. The driving transistor DR operates so that a driving current flows between a power supply line EVDD (high potential voltage) and a cathode power supply line EVSS (low potential voltage) in accordance with the data voltage stored in the capacitor Cst. The organic light emitting diode OLED operates to emit light in accordance with the driving current generated by the driving transistor DR.

The compensation circuit CC is a circuit which is added in the sub-pixel to compensate a threshold voltage or the like of the driving transistor DR. The compensation circuit CC is constituted by one or more transistors. The configuration of the compensation circuit CC varies greatly according to an external compensation method, and an example of the compensation circuit CC will be described as follows.

As illustrated in FIG. 3, the compensation circuit CC includes a sensing transistor ST and a sensing line VREF (or a reference line). The sensing transistor ST is connected between a source electrode of the driving transistor DR and an anode electrode of the organic light emitting diode OLED (hereinafter referred to as a sensing node). The sensing transistor ST operates to supply an initialization voltage (or a sensing voltage) transmitted through the sensing line VREF to the sensing node of the driving transistor DR or sense a voltage or current of the sensing node of the driving transistor DR or the sensing line VREF.

In the switching transistor SW, the source electrode or the drain electrode is connected to the data line DL and the other one of the source electrode and the drain electrode is connected to the gate electrode of the driving transistor DR. In the driving transistor DR, the source electrode or the drain electrode is connected to the power supply line EVDD and the other one of the source electrode and the drain electrode is connected to a lower electrode which is an anode of the organic light emitting diode OLED. In the capacitor Cst, a capacitor lower electrode is connected to the gate electrode of the driving transistor DR and a capacitor upper electrode is connected to the lower electrode of the organic light emitting diode OLED. In the organic light emitting diode OLED, a lower electrode is connected to the other one of the source electrode and the drain electrode of the driving transistor DR and an upper electrode, which is a cathode electrode, is connected to a second power supply line EVSS. In the sensing transistor ST, a source electrode or a drain electrode is connected to the sensing line VREF and the other of the source electrode and the drain electrode is connected to the lower electrode of the organic light emitting diode OLED which is the sensing node and the other one of the source electrode and the drain electrode of the driving transistor DR.

The operation time of the sensing transistor ST may be similar to or the same as, or different from that of the switching transistor SW depending on an external compensation algorithm (or a configuration of the compensation circuit). For example, the gate electrode of the switching transistor SW may be connected to the first gate line GL1, and the gate electrode of the sensing transistor ST may be connected to the second gate line GL2. In this case, a scan signal Scan is transmitted to the first gate line GL1 and a sensing signal Sense is transmitted to the second gate line GL2. As another example, the first gate line GL1 connected to the gate electrode of the switching transistor SW and the second gate line GL2 connected to the gate electrode of the sensing transistor ST may be connected to each other to share in common.

The sensing line VREF may be connected to the data driver. In this case, the data driver may sense the sensing node of the sub-pixel during a non-display period of the image or an N frame (N is an integer of 1 or more) in real time and generate a sensing result. On the other hand, the switching transistor SW and the sensing transistor ST may be turned on at the same time. In this case, the sensing operation through the sensing line VREF and the data output operation for outputting the data signal are separated (distinguished) from each other based on a time division system of the data driver.

In addition, an object to be compensated according to the sensing result may be a digital data signal, an analog data signal, a gamma, or the like. A compensation circuit for generating a compensation signal (or a compensation voltage) based on the sensing result may be implemented in the data driver, in the timing controller, or in a separate circuit.

In FIG. 3, the sub-pixel having a 3T (Transistor) 1C (Capacitor) structure including the switching transistor SW, the driving transistor DR, the capacitor Cst, the organic light emitting diode OLED, and the sensing transistor ST has been described as an example, but if the compensation circuit CC is added, the sub-pixel may also be constituted by 3T2C, 4T2C, 5T1C, 6T2C, and the like.

Figure 4:
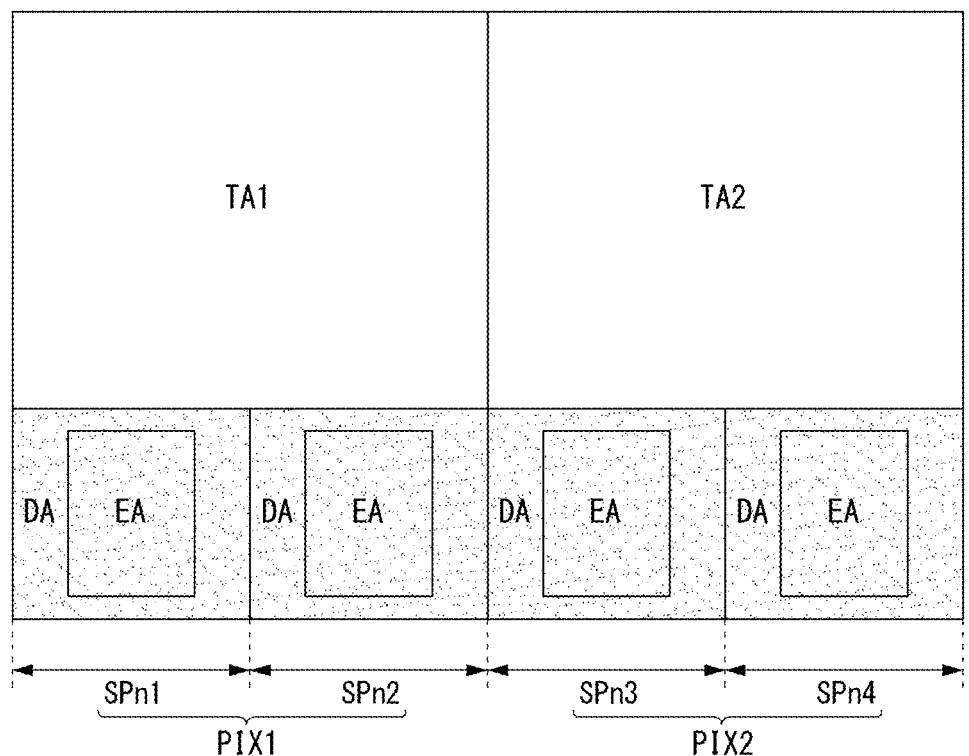
FIG. 4 is a plan view schematically illustrating a layout of sub-pixels of the organic light emitting display, according to an embodiment of the present disclosure.
Figure 5:
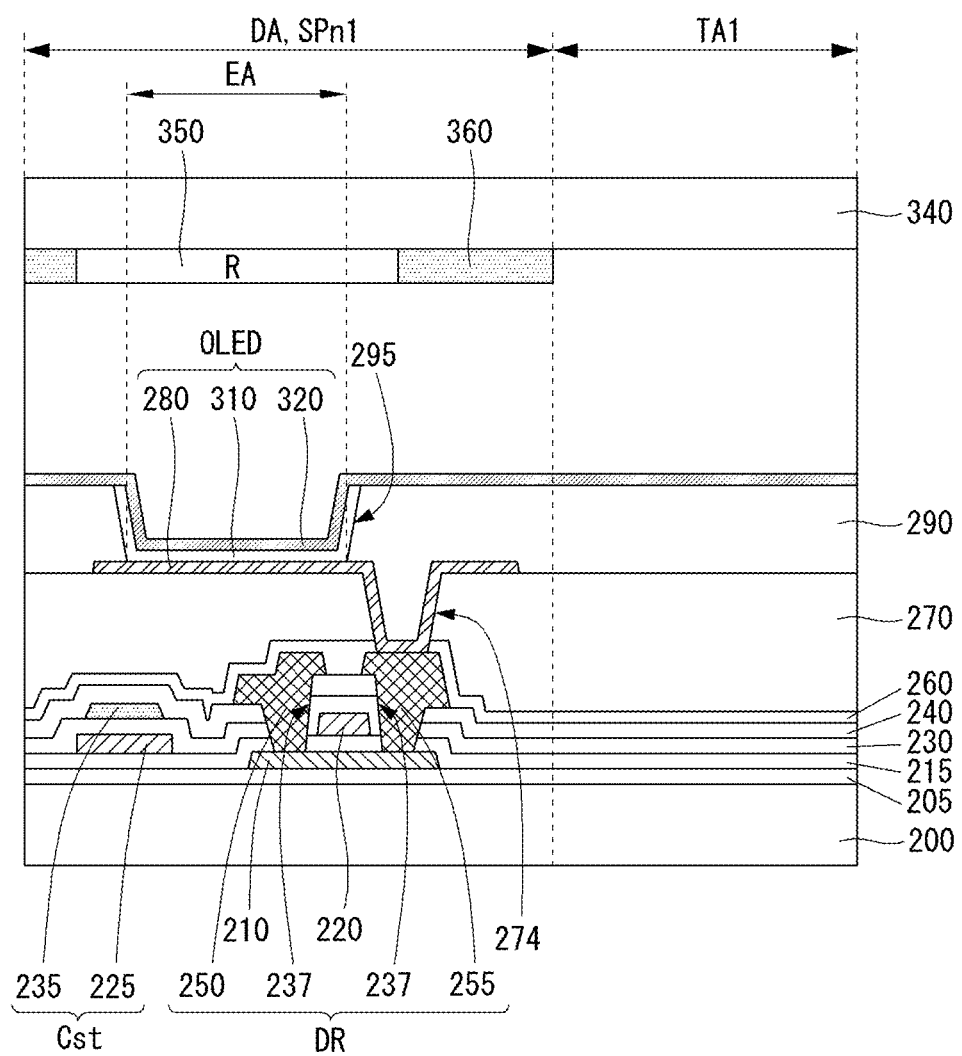
FIG. 5 is a cross-sectional view of a sub-pixel according to Comparative Example of the present disclosure.
Figure 6:
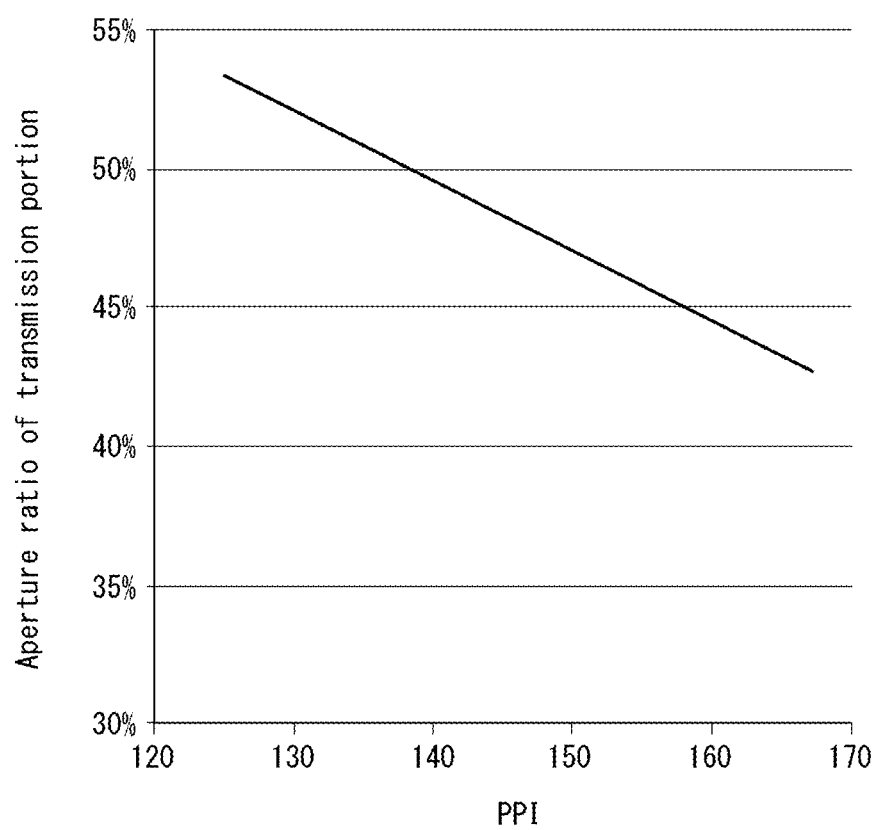
FIG. 6 is an example graph illustrating an aperture ratio of a transmission portion according to PPI.
Figure 7:
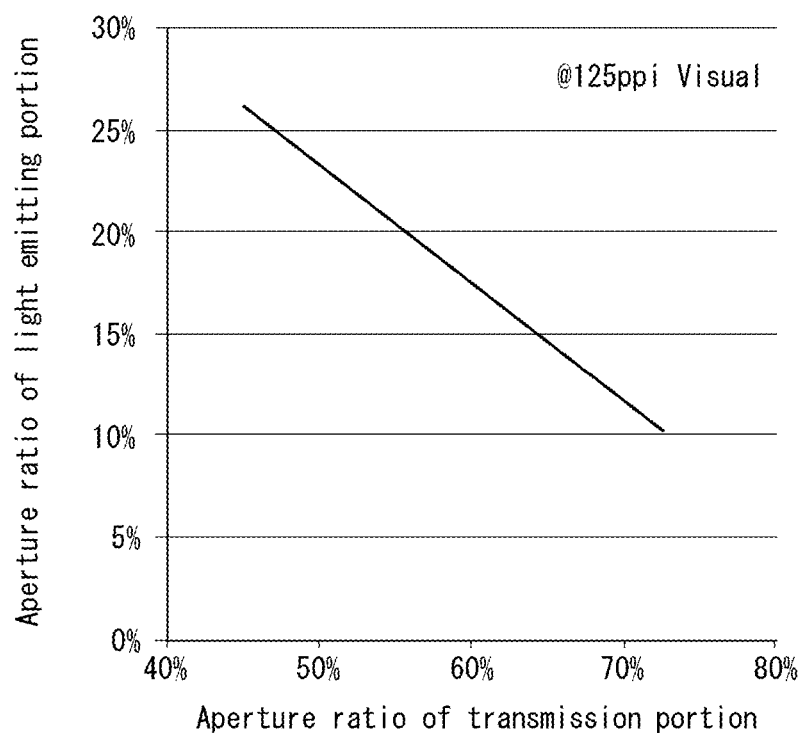
FIG. 7 is an example graph illustrating an aperture ratio of a light emitting portion according to an aperture ratio of the transmission portion.
Figure 8:
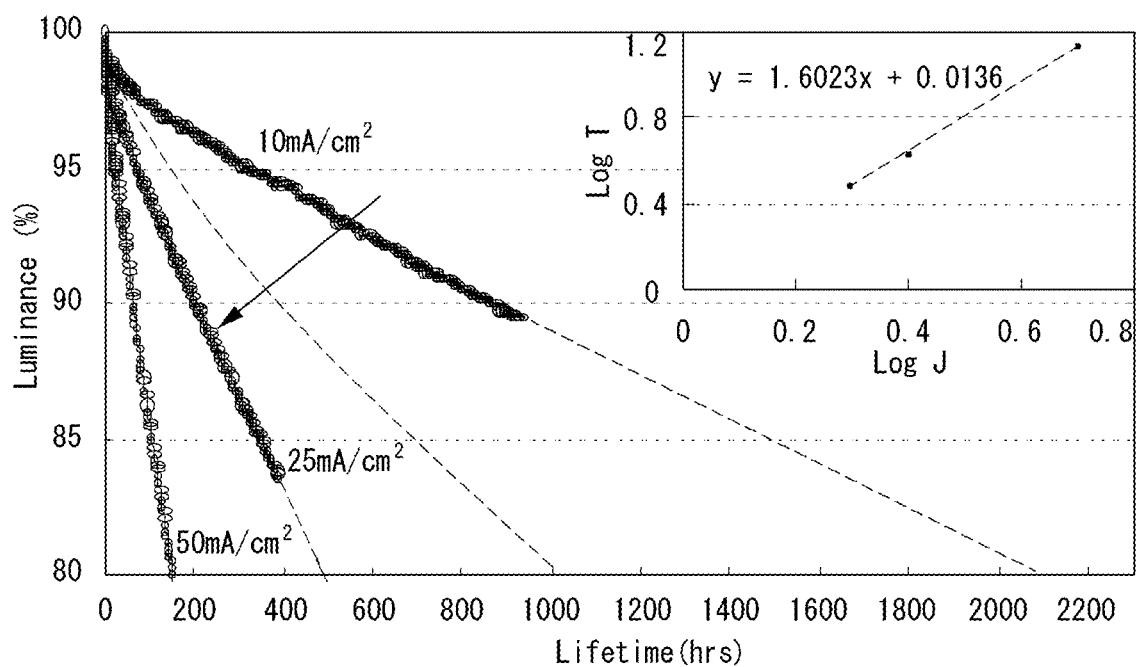
FIG. 8 is an example graph illustrating a relationship between a lifetime and brightness according to a current density of an element.

FIG. 4 is a plan view schematically illustrating a layout of sub-pixels of the organic light emitting display according to an embodiment of the present disclosure, FIG. 5 is a cross-sectional view of a sub-pixel according to Comparative Example of the present disclosure, FIG. 6 is an example graph illustrating an aperture ratio of a transmission portion according to PPI, FIG. 7 is an example graph illustrating an aperture ratio of a light emitting portion according to an aperture ratio of the transmission portion, and FIG. 8 is an example graph illustrating a relationship between a lifetime and brightness according to a current density of an element.

Referring to FIG. 4, the organic light emitting display device of the present disclosure is a transparent display device that may be viewed through the rear surface from the front surface of the display device. The transparent organic light emitting display device includes first to fourth sub-pixels SPn1 to SPn4 for emitting light.

The first to fourth sub-pixels SPn1 to SPn4 are arranged with four sub-pixels in one row. The first and second sub-pixels SPn1 and SPn2 constitute one first pixel PIX1 and the third and fourth sub-pixels SPn3 and SPn4 constitute one second pixel PIX2. Each of the first to fourth sub-pixels SPn1 to SPn4 includes a light emitting portion EA having a light emitting element for emitting light and a circuit portion DA for driving the light emitting element.

Each light emitting portion EA of each of the first to fourth sub-pixels SPn1 to SPn4 emits red R, blue B and green G, respectively. For example, the first sub-pixel SPn1 may emit red R light, the second sub-pixel SPn2 and the fourth sub-pixel SPn4 may emit green G light, and the third sub-pixel SPn3 may emit blue B light. However, the arrangement order of the sub-pixels may be variously changed depending on a light emitting material, a light emitting area, a configuration (or structure) of the compensation circuit, and the like.

Each of the first to fourth sub-pixels SPn1 to SPn4 has a transmission portion for transmitting light to the upper side of the light emitting portion EA. Specifically, the first and second sub-pixels SPn1 and SPn2 have a first transmission portion TA1, and the third and fourth sub-pixels SPn3 and SPn4 have a second transmission portion TA2.

Referring to FIG. 5, a cross-sectional structure of the sub-pixel will be described.

Referring to FIG. 5, in an organic light emitting display device according to Comparative Example of the present disclosure, a buffer layer 205 is disposed on a first substrate 200. The first substrate 200 may be formed of glass, plastic, or metal. In the first substrate 200, a first sub-pixel SPn1 and a first transmission portion TA1 are defined. The buffer layer 205 serves to protect a thin film transistor formed in a subsequent process from impurities such as alkali ions or the like, which are discharged from the first substrate 200. The buffer layer 205 may be silicon oxide (SiOx), silicon nitride (SiNx), or a multilayer thereof.

A semiconductor layer 210 is disposed on the buffer layer 205. The semiconductor layer 210 may be formed of a silicon semiconductor or an oxide semiconductor. The silicon semiconductor may include amorphous silicon or crystallized polycrystalline silicon. Here, the polycrystalline silicon has high mobility (100 $cm^2$/Vs or more), low energy consumption power, and excellent reliability to be applied to a gate driver for a driving device and/or a multiplexer MUX or to a driving TFT in a pixel. On the other hand, since the oxide semiconductor has a low off-current, the oxide semiconductor is suitable for a switching TFT which maintains a short ON time and a long OFF time. Further, since the oxide semiconductor has the small off current and a long voltage holding period of the pixel, the oxide semiconductor is suitable for a display device requiring low speed driving and/or low power consumption. In addition, the semiconductor layer 210 includes a source region and a drain region including p-type or n-type impurities, and includes a channel therebetween.

A gate insulating layer 215 is disposed on the semiconductor layer 210. The gate insulating layer 215 may be silicon oxide (SiOx), silicon nitride (SiNx), or a multilayer thereof. On the gate insulating layer 215, the gate electrode 220 is disposed in a predetermined region of the semiconductor layer 210, that is, a position corresponding to a channel when impurities are injected, and a capacitor lower electrode 225 is disposed in a region spaced apart by a predetermined distance. The gate electrode 220 and the capacitor lower electrode 225 may be formed of any one selected from the group consisting of molybdenum (Mo), aluminum (Al), chromium (Cr), gold (Au), titanium (Ti), nickel (Ni), neodymium (Nd), and copper (Cu) or an alloy thereof. In addition, the gate electrode 220 and the capacitor lower electrode 225 may be a multilayer formed of any one selected from the group consisting of molybdenum (Mo), aluminum (Al), chromium (Cr), gold (Au), titanium (Ti), nickel (Ni), neodymium (Nd), and copper (Cu) or an alloy thereof. For example, the gate electrode 220 and the capacitor lower electrode 225 may be a double layer of molybdenum/aluminum-neodymium or molybdenum/aluminum.

A first interlayer insulating layer 230 is formed on the gate electrode 220 and the capacitor lower electrode 225 to insulate the gate electrode 220 and the capacitor lower electrode 225 from each other. The first interlayer insulating layer 230 may be silicon oxide (SiOx), silicon nitride (SiNx), or a multilayer thereof. A capacitor upper electrode 235 corresponding to the capacitor lower electrode 225 is disposed on the first interlayer insulating layer 230. The capacitor upper electrode 235 may be formed of any one selected from the group consisting of molybdenum (Mo), aluminum (Al), chromium (Cr), gold (Au), titanium (Ti), nickel (Ni), neodymium (Nd), and copper (Cu) or an alloy thereof. Accordingly, the capacitor lower electrode 225 and the capacitor upper electrode 235 constitute the capacitor Cst.

A second interlayer insulating layer 240 is disposed on the first interlayer insulating layer 230 to insulate the capacitor upper electrode 235. The second interlayer insulating layer 240 may be formed of the same material as the first interlayer insulating layer 230. The gate insulating layer 215, the first interlayer insulating layer 230, and the second interlayer insulating layer 240 are formed with contact holes 237 exposing the semiconductor layer 210.

A drain electrode 250 and a source electrode 255 are disposed on the second interlayer insulating layer 240. The drain electrode 250 and the source electrode 255 are connected to the semiconductor layer 210 through the contact holes 237, respectively. The drain electrode 250 and the source electrode 255 may be formed of a single layer or a multilayer, and when the drain electrode 250 and the source electrode 255 are formed of the single layer, the drain electrode 250 and the source electrode 255 may be formed of any one selected from the group consisting of molybdenum (Mo), aluminum (Al), chromium (Cr), gold (Au), titanium (Ti), nickel (Ni), neodymium (Nd), and copper (Cu) or an alloy thereof. When the drain electrode 250 and the source electrode 255 are formed of the multilayer, the drain electrode 250 and the source electrode 255 may be formed of a double layer of molybdenum/aluminum-neodymium, and a triple layer of titanium/aluminum/titanium, molybdenum/aluminum/molybdenum or molybdenum/aluminum-neodymium/molybdenum. Accordingly, a driving transistor DR including the semiconductor layer 210, the gate electrode 220, the drain electrode 250 and the source electrode 255 is constituted.

A passivation layer 260 is disposed on the first substrate 200 including the driving transistor DR. The passivation layer 260 may be a silicon oxide (SiOx) layer, a silicon nitride (SiNx) layer, or a multilayer thereof, as an insulating layer for protecting a lower element. An overcoat layer 270 is disposed on the passivation layer 260. The overcoat layer 270 may be a planarization layer for reducing a step of the lower structure and is formed of an organic material such as polyimide, a benzocyclobutene series resin, or polyacrylate. A via hole 274 is disposed in the overcoat layer 270 and the passivation layer 260 to expose the source electrode 255 of the driving transistor DR.

An organic light emitting diode OLED is disposed on the overcoat layer 270. More specifically, a lower electrode 280 is disposed on the overcoat layer 270 in which the via hole 274 is formed. The lower electrode 280 serves as a pixel electrode and is connected to the source electrode 255 of the driving transistor DR through the via hole 274. The lower electrode 280 as an anode may be formed of a transparent conductive material such as indium tin oxide (ITO), indium zinc oxide (IZO), or zinc oxide (ZnO). Since the present disclosure is an organic light emitting display device having a top emission structure, the lower electrode 280 is a reflective electrode. Accordingly, the lower electrode 280 may further include a reflective layer. The reflective layer may be formed of aluminum (Al), copper (Cu), silver (Ag), nickel (Ni) or an alloy thereof, preferably a silver/palladium/copper (APC) alloy.

A bank layer 290 for partitioning the pixels is disposed on the overcoat layer 270 on which the lower electrode 280 is formed. The bank layer 290 is formed of an organic material such as polyimide, a benzocyclobutene series resin, or polyacrylate. In the bank layer 290, an opening 295 for exposing the lower electrode 280 is disposed.

An organic layer 310 is disposed on the first substrate 200 on which the bank layer 290 is formed. The organic layer 310 is formed to overlap with at least the opening 295 of the bank layer 290 to be in contact with the lower electrode 280. The organic layer 310 may include at least one light emitting layer which emits light by combining electrons and holes and include at least one selected from a hole injection layer, a hole transport layer, an electron transport layer, and an electron injection layer.

An upper electrode 320 is disposed on the organic layer 310. The upper electrode 320 is disposed on a front surface of the first substrate 200 and may be a cathode electrode. The upper electrode 320 may be formed of magnesium (Mg), calcium (Ca), aluminum (Al), silver (Ag), or an alloy thereof. The upper electrode 320 may be a transparent electrode capable of transmitting light.

A second substrate 340 facing the first substrate 200 is disposed. The second substrate 340 may be a transparent glass substrate or a plastic substrate through which light may pass. A color filter 350 and a black matrix 360 are disposed on one surface of the second substrate 340, for example, on a surface facing the first substrate 200. The color filter 350 is provided to improve the color purity of the light emitted from the organic light emitting diode.

The organic light emitting display device configured as described above implements images by emitting red, blue, and green light from the light emitting portion of each sub-pixel, and may implement a transparent display device by emitting light incident from the first substrate 200 or the second substrate 340 from the transmission portion of each sub-pixel.

Meanwhile, referring to FIG. 6, in the organic light emitting display device, an aperture ratio of the transmission portion is gradually reduced toward a high resolution (high pixels per inch (PPI)) due to an area of the circuit portion for driving the light emitting portion in each sub-pixel. Further, as illustrated in FIG. 7, when the aperture ratio of the transmission portion is increased, the aperture ratio of the light emitting portion of each sub-pixel is reduced. When the aperture ratio of the light emitting portion is reduced, the current density of the organic light emitting diode formed in each sub-pixel is increased. Accordingly, as illustrated in FIG. 8, if the current density of the organic light emitting diode formed in each sub-pixel is increased, the lifetime of the organic light emitting diode is gradually reduced. That is, FIG. 8 illustrates a result that the aperture ratio and the current density of the light emitting portion is inversely proportional to each other and the luminance and lifetime are also inversely proportional to each other.

Hereinafter, there is disclosed a display device capable of improving the aperture ratios of the light emitting portion and the transmission portion and improving the color purity thereof.

Embodiments

Figure 9:
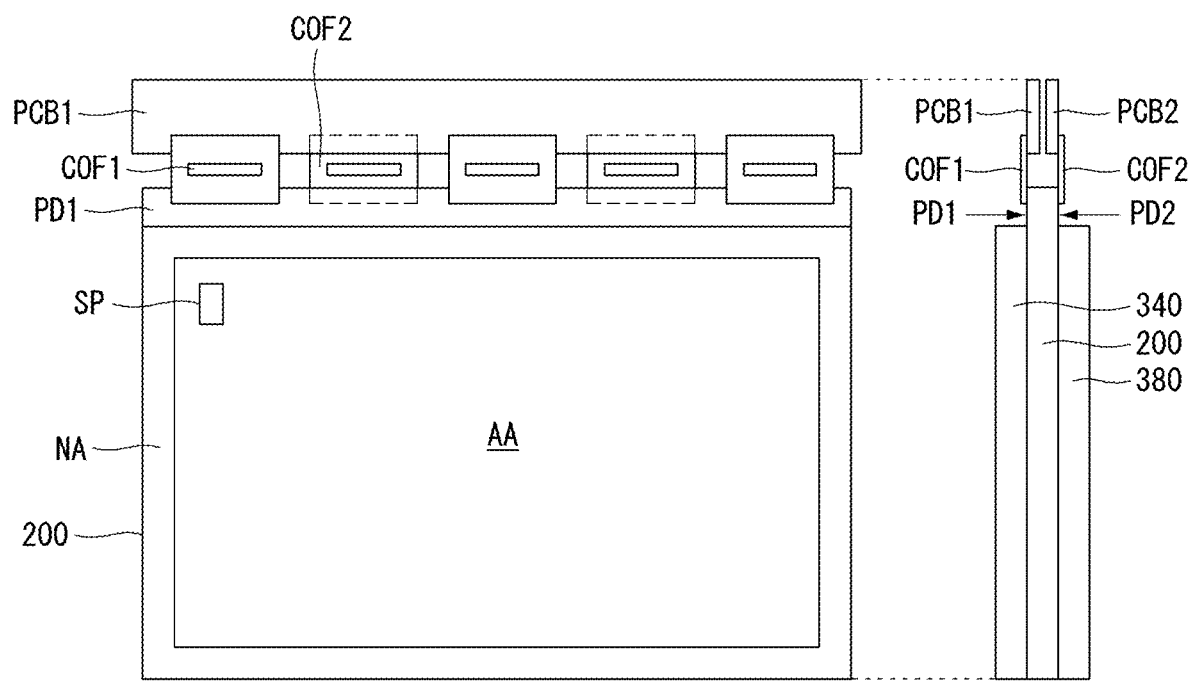
FIG. 9 is a plan view illustrating an organic light emitting display device according to an exemplary embodiment of the present disclosure.
Figure 10:
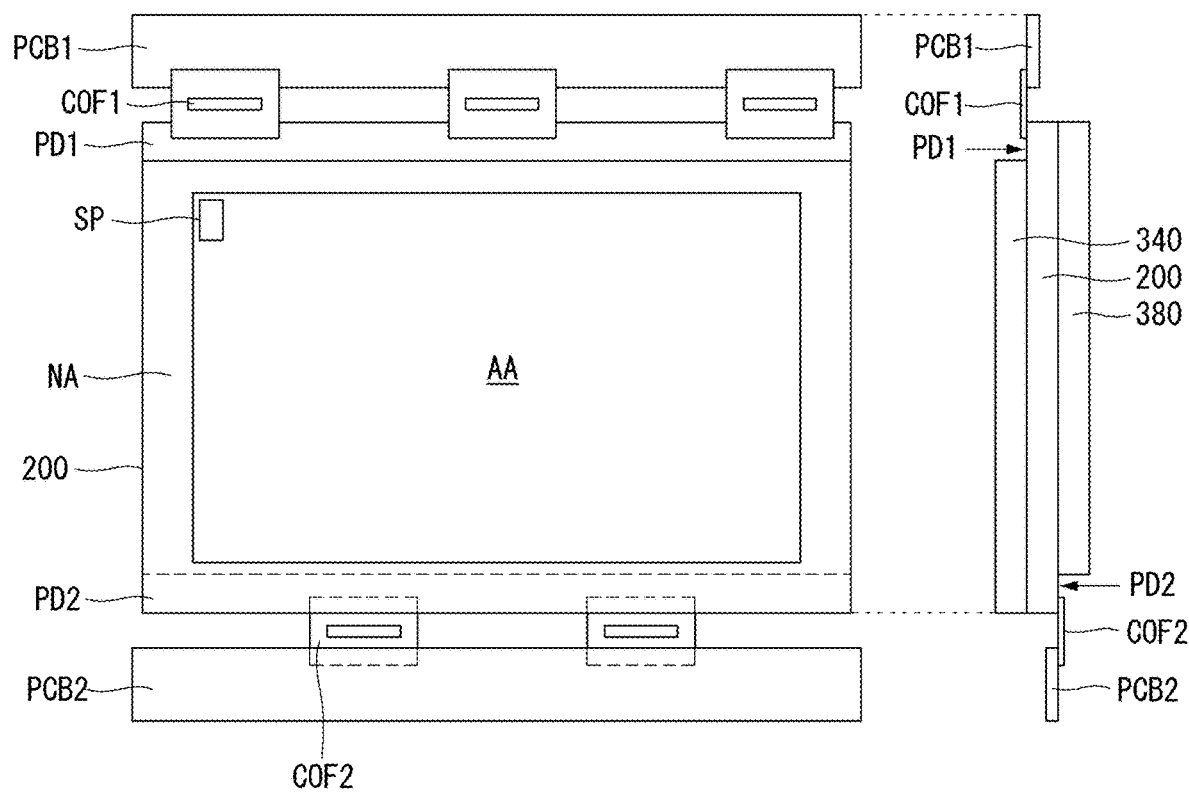
FIG. 10 is a plan view illustrating an organic light emitting display device according to another exemplary embodiment of the present disclosure.
Figure 11:
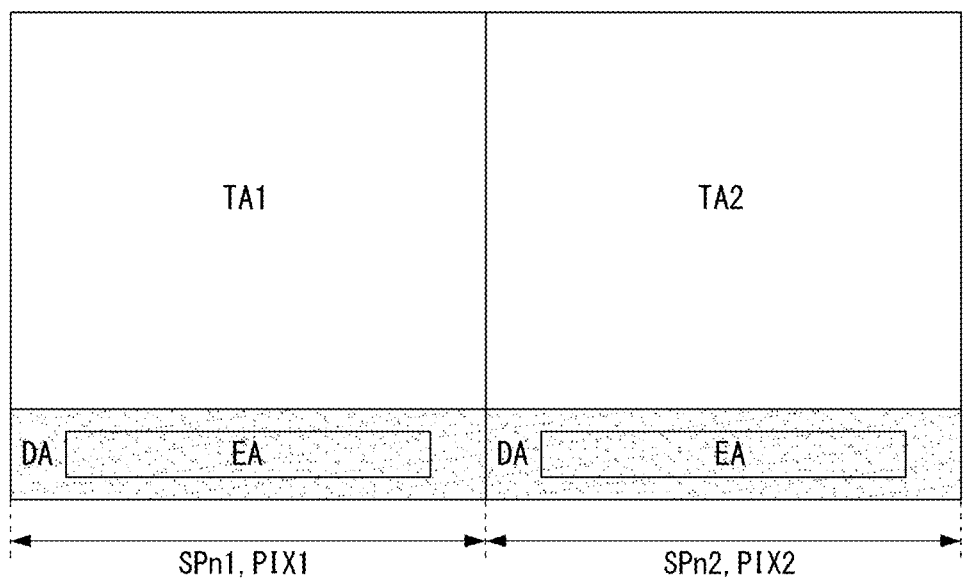
FIG. 11 is a diagram schematically illustrating a sub-pixel array of the organic light emitting display device according to the exemplary embodiment of the present disclosure.
Figure 12:
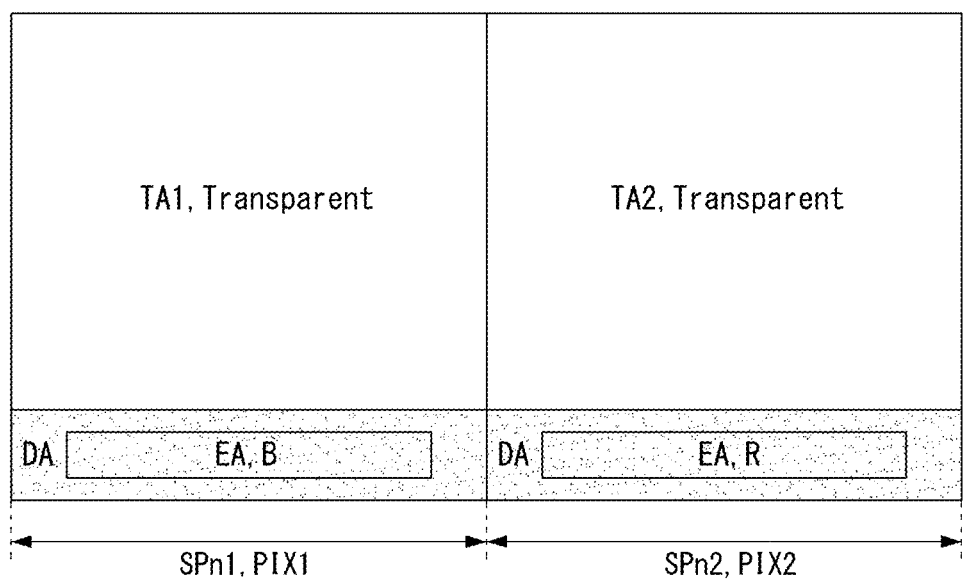
FIG. 12 is a diagram illustrating a front surface of the sub-pixel array of FIG. 11, according to an embodiment of the present disclosure.
Figure 13:
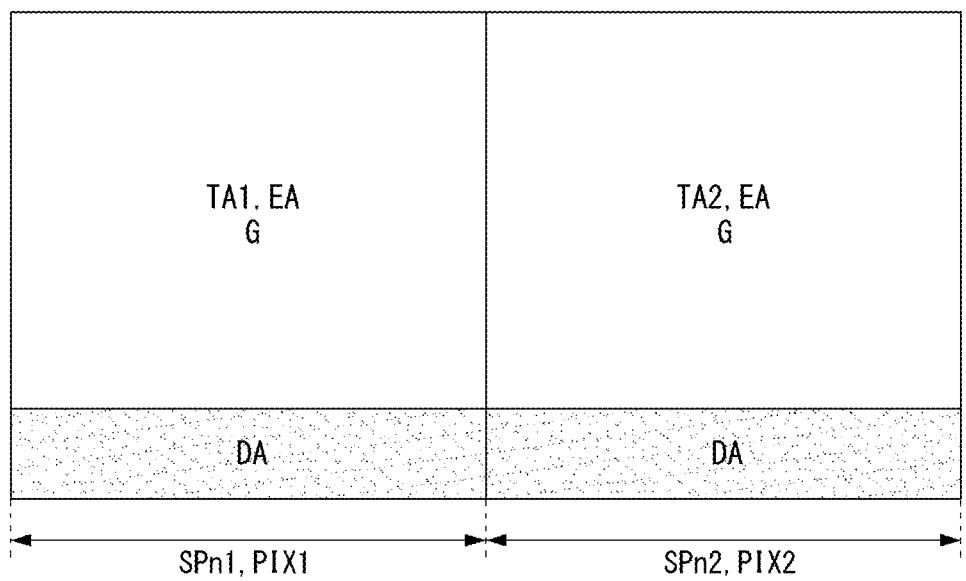
FIG. 13 is a diagram illustrating a rear surface of the sub-pixel array of FIG. 11, according to an embodiment of the present disclosure.

FIG. 9 is a plan view illustrating an organic light emitting display device according to an exemplary embodiment of the present disclosure, FIG. 10 is a plan view illustrating an organic light emitting display device according to another exemplary embodiment of the present disclosure, FIG. 11 is a diagram schematically illustrating a sub-pixel array of the organic light emitting display device according to the exemplary embodiment of the present disclosure, FIG. 12 is a diagram illustrating a front surface of the sub-pixel array of FIG. 11, according to an embodiment of the present disclosure, and FIG. 13 is a diagram illustrating a rear surface of the sub-pixel array of FIG. 11, according to an embodiment of the present disclosure.

Referring to FIG. 9, an organic light emitting display device according to an exemplary embodiment of the present disclosure includes a display area AA and a non-display area NA on a first substrate 200.

A plurality of sub-pixels SP are arranged in the display area AA to emit R, G, and B light, thereby implementing full color. The display area AA includes first organic light emitting diodes disposed on a front surface of the first substrate 200 and second organic light emitting diodes disposed on a rear surface of the first substrate 200. The first organic light emitting diode and the second organic light emitting diode will be described below.

The non-display area NA includes a first pad portion PD1 and a second pad portion PD2 disposed on one side of the first substrate 200. The first pad portion PD1 is disposed on the front surface of the first substrate 200 and the second pad portion PD2 is disposed on the rear surface of the first substrate 200. First chip-on films COF1 for driving the first organic light emitting diode are attached to the first pad portion PD1 and second chip-on films COF2 for driving the second organic light emitting diode are attached to the second pad portion PD2. One end of the first chip-on film COF1 is connected to the first pad portion PD1 and the other end of the first chip-on film COF1 is connected to a first printed circuit board PCB1. The first chip-on film COF1 transmits signals such as a scan signal, a data signal, and a power supply signal, which are applied from the first printed circuit board PCB1, to the first organic light emitting diode of the display area AA. One end of the second chip-on film COF2 is connected to the second pad portion PD2 and the other end of the second chip-on film COF2 is connected to a second printed circuit board PCB2. The second chip-on film COF2 transmits signals such as a scan signal, a data signal, and a power supply signal, which are applied from the second printed circuit board PCB2, to the second organic light emitting diode of the display area AA. The first pad portion PD1 and the second pad portion PD2 overlap with each other with the first substrate 200 interposed therebetween and the first printed circuit board PCB1 and the second printed circuit board PCB2 may also overlap with each other with the first substrate 200 interposed therebetween.

In FIG. 9 described above, it is illustrated that the first and second pad portions PD1 and PD2, the first and second chip-on films COF1 and COF2, and the first and second printed circuit boards PCB1 and PCB2 are provided on one side of the first substrate 200.

Meanwhile, referring to FIG. 10, in the organic light emitting display device of the present disclosure, the first pad portion PD1, the first chip-on film COF1, and the first printed circuit board PCB1 may be disposed on a front surface of one side of the first substrate 200. The first printed circuit board PCB1 is electrically connected to the first pad portion PD1 through the first chip-on film COF1. The second pad portion PD2, the second chip-on film COF2, and the second printed circuit board PCB2 may be disposed on a rear surface of the other side of the first substrate 200. The second printed circuit board PCB2 is electrically connected to the second pad portion PD2 through the second chip-on film COF2. The first pad portion PD1 and the second pad portion PD2 may not overlap with each other with the first substrate 200 interposed therebetween and the first printed circuit board PCB1 and the second printed circuit board PCB2 may also not overlap with each other with the first substrate 200 interposed therebetween.

The arrangement of the sub-pixels of the organic light emitting display device of the present disclosure described above will be described in more detail below.

Referring to FIG. 11, an organic light emitting display device according to an exemplary embodiment of the present disclosure includes a first sub-pixel SPn1 and a second sub-pixel SPn2.

The first sub-pixel SPn1 and the second sub-pixel SPn2 each function as one pixel. That is, the first sub-pixel SPn1 constitutes one first pixel PIX1 and the second sub-pixel SPn2 constitutes one second pixel PIX2. Each of the first sub-pixel SPn1 and the second sub-pixel SPn2 includes a light emitting portion EA having an organic light emitting diode for emitting light and a circuit portion DA for driving the organic light emitting diode.

Each light emitting portion EA of the first sub-pixel SPn1 and the second sub-pixel SPn2 emits one light selected from red R, blue B and green G. For example, the first sub-pixel SPn1 may emit blue B light, and the second sub-pixel SPn2 may emit red R light. The first sub-pixel SPn1 and the second sub-pixel SPn2 include first and second transmission portions TA1 and TA2 for transmitting light on the upper side of the light emitting portion EA. Specifically, the first sub-pixel SPn1 includes the first transmission portion TA1 and the second sub-pixel SPn2 includes the second transmission portion TA2.

Meanwhile, the organic light emitting display device of the present disclosure may emit light from the first transmission portion TA1 and the second transmission portion TA2. Although FIG. 11 illustrates two sub-pixels for the sake of simplicity, in general, the display device may include a plurality of sub-pixels, and each sub-pixel may include a corresponding part of the first substrate with a circuit portion DA and a transmission portion TA. The transmission portion TA may be adjacent the circuit portion DA, and may be configured to transmit light.

FIG. 12 is a diagram illustrating sub-pixels disposed on the front surface of the first substrate. Referring to FIG. 12, the front surface of the first substrate is configured to emit blue B light from the light emitting portion EA of the first sub-pixel SPn1 and to transmit light from the first transmission portion TA1. The front surface of the first substrate is configured so that the light emitting portion EA of the second sub-pixel SPn2 emits red R light and the second transmission portion TA2 transmits light. Therefore, external light is transmitted from the first and second transmission portions TA1 and TA2 to be transparent, and the light emitted from each light emitting portion EA may be emitted.

FIG. 13 is a diagram illustrating sub-pixels disposed on the rear surface of the first substrate. Referring to FIG. 13, the rear surface of the first substrate is configured so that green G light is emitted from the first transmission portion TA1 of the first sub-pixel SPn1 and green G light is emitted from the second transmission portion TA2 of the second sub-pixel SPn2. The light emitted from each of the transmission portions TA1 and TA2 of the first and second sub-pixels SPn1 and SPn2 is emitted to the front surface of the first substrate.

In the first sub-pixel SPn1, a first organic light emitting diode is formed in the circuit portion DA and the light emitting portion EA on the front surface of the first substrate to emit light to the front surface of the first substrate and transmit the light from the first transmission portion TA1. In addition, a second organic light emitting diode is formed in the first transmission portion TA1 and the light emitting portion EA on the rear surface of the first substrate and the light emitted from the second organic light emitting diode may be emitted through the first transmission portion TA1.

Accordingly, the organic light emitting display device of the present disclosure may implement a transparent mode in which light is emitted through the light emitting portion EA in one sub-pixel and simultaneously, external light is transmitted through the transmission portion. Further, the organic light emitting display device of the present disclosure may implement a non-transparent mode in which light is emitted through the light emitting portion EA in one sub-pixel and simultaneously, light of a different color is transmitted through the transmission portion.

Hereinafter, the organic light emitting display device of the present disclosure will be described in detail while describing the cross-sectional structure of the sub-pixel.

Figure 14:
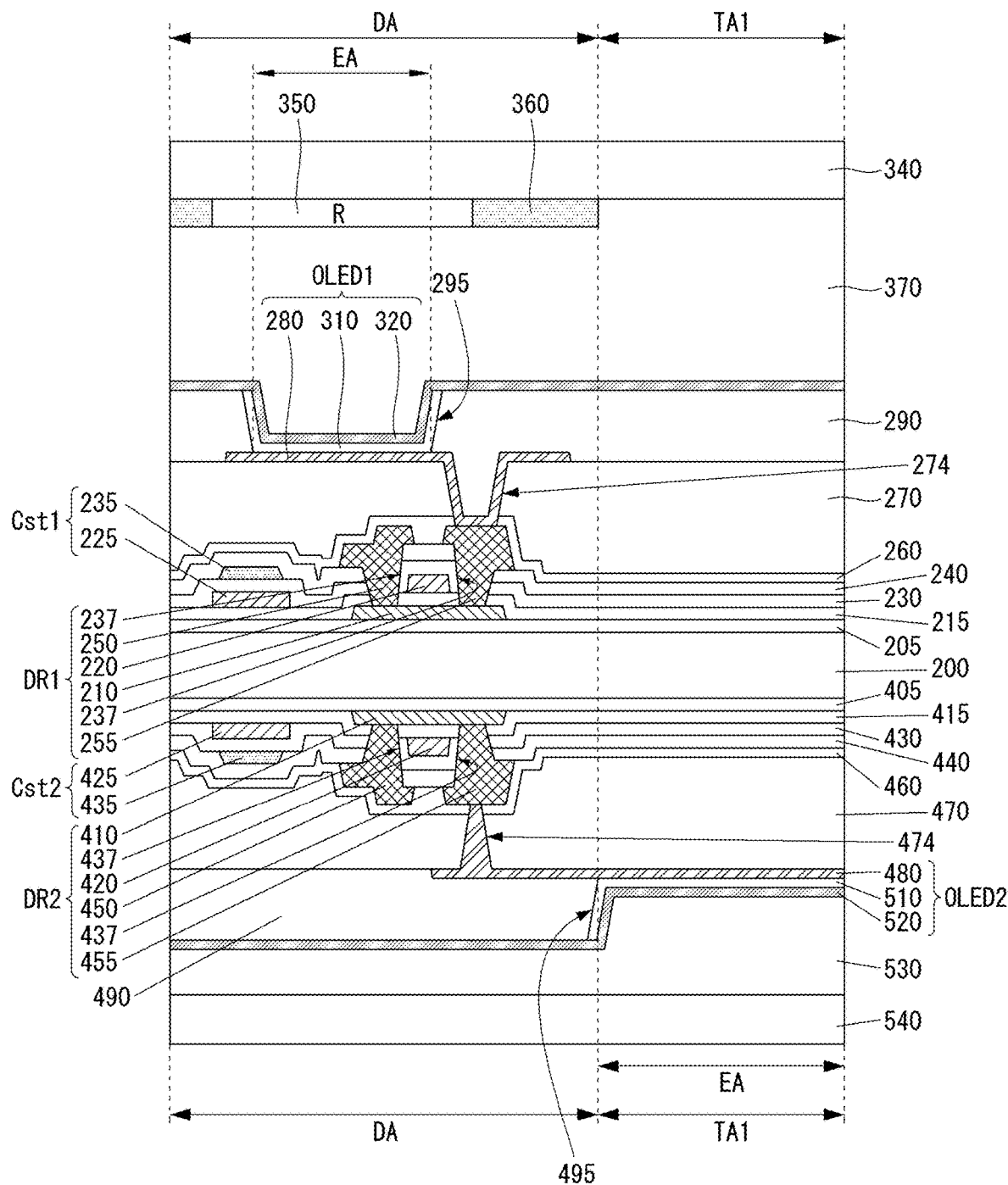
FIG. 14 is a cross-sectional view illustrating a sub-pixel of the organic light emitting display device according to the exemplary embodiment of the present disclosure.

FIG. 14 is a cross-sectional view illustrating a sub-pixel of an organic light emitting display device according to an exemplary embodiment of the present disclosure. In the following, the same reference numerals are designated to the same components as those in FIG. 5 described above, and the description thereof will be simplified.

Referring to FIG. 14, the organic light emitting display device according to the exemplary embodiment of the present disclosure may include a first driving transistor DR1 and a first organic light emitting diode OLED1 electrically connected to the first driving transistor DR1 on a first substrate 200.

Specifically, a circuit portion DA, a light emitting portion EA, and a first transmission portion TA1 are defined on a front surface of a corresponding part of the first substrate 200 for a pixel. A first buffer layer 205 is disposed on the first substrate 200 and a first semiconductor layer 210 is disposed on the first buffer layer 205. A first gate insulating layer 215 is disposed on the first semiconductor layer 210 and a first gate electrode 220 is disposed on the first gate insulating layer 215 at a position corresponding to a channel of the first semiconductor layer 210. A first capacitor lower electrode 225 is disposed in a region spaced apart from the first gate electrode 220.

A first lower interlayer insulating layer 230 is disposed on the first gate electrode 220 and the first capacitor lower electrode 225 and a first capacitor upper electrode 235 is disposed on the first lower interlayer insulating layer 230. Accordingly, the first capacitor lower electrode 225 and the first capacitor upper electrode 235 constitute a first capacitor Cst. A first upper interlayer insulating layer 240 is disposed on the first lower interlayer insulating layer 230 to insulate the first capacitor upper electrode 235. The first gate insulating layer 215, the first lower interlayer insulating layer 230, and the first upper interlayer insulating layer 240 are formed with first contact holes 237 exposing the first semiconductor layer 210.

A first drain electrode 250 and a first source electrode 255 are disposed on the first upper interlayer insulating layer 240. The first drain electrode 250 and the first source electrode 255 are connected to the first semiconductor layer 210 through the first contact holes 237, respectively. Accordingly, a first driving transistor DR1 including the first semiconductor layer 210, the first gate electrode 220, the first drain electrode 250 and the first source electrode 255 is constituted.

A first passivation layer 260 is disposed on the first substrate 200 including the first driving transistor DR1 and a first overcoat layer 270 is disposed on the first passivation layer 260. A first via hole 274 is disposed in the first overcoat layer 270 and the first passivation layer 260 to expose the first source electrode 255 of the first driving transistor DR1.

A first organic light emitting diode OLED1 is disposed on the first overcoat layer 270. More specifically, a first lower electrode 280 is disposed on the first overcoat layer 270 in which the first via hole 274 is formed. The first lower electrode 280 serves as a pixel electrode and is connected to the first source electrode 255 of the first driving transistor DR1 through the first via hole 274. The first lower electrode 280 as an anode may be formed of a transparent conductive material such as indium tin oxide (ITO), indium zinc oxide (IZO), or zinc oxide (ZnO). Since the present invention is an organic light emitting display device having a top emission structure, the first lower electrode 280 is a reflective electrode. Accordingly, the first lower electrode 280 may further include a reflective layer.

A first bank layer 290 for partitioning the pixels is disposed on the first overcoat layer 270 on which the first lower electrode 280 is formed. In the first bank layer 290, a first opening 295 for exposing the first lower electrode 280 is disposed.

A first organic layer 310 is disposed on the first substrate 200 on which the first bank layer 290 is formed. The first organic layer 310 overlaps with at least the first opening 295 of the first bank layer 290 to be in contact with the first lower electrode 280. The first organic layer 310 may include at least one light emitting layer which emits light by combining electrons and holes and include at least one selected from a hole injection layer, a hole transport layer, an electron transport layer, and an electron injection layer.

A first upper electrode 320 is disposed on the first organic layer 310. The first upper electrode 320 is disposed on the front surface of the first substrate 200 and may be a cathode electrode. The first upper electrode 320 may be formed of magnesium (Mg), calcium (Ca), aluminum (Al), silver (Ag), or an alloy thereof. The first upper electrode 320 may be a transparent electrode capable of transmitting light. Accordingly, the first organic light emitting diode OLED1 including the first lower electrode 280, the first organic layer 310, and the first upper electrode 320 is constituted.

The first driving transistor DR1 and the first organic light emitting diode OLED1 described above are disposed in the circuit portion DA of the first substrate 200 and disposed in the light emitting portion EA or the circuit portion DA of the first organic light emitting diode OLED1. The first driving transistor DR1 and the first organic light emitting diode OLED1 may be disposed on one surface, for example, a front surface of the first substrate 200 in the circuit portion DA.

A second substrate 340 facing the first substrate 200 is disposed. The second substrate 340 may be a transparent glass substrate or a plastic substrate through which light may pass. A color filter 350 and a black matrix 360 may be further disposed on one surface of the second substrate 340, for example, on a surface facing the first substrate 200. The color filter 350 is provided to improve the color purity of the light emitted from the organic light emitting diode. The black matrix 360 is disposed in the circuit portion DA and is not disposed in the first transmission portion TA1 so as not to affect the transmission of light. The color filter 350 and the black matrix 360 may be disposed in the circuit portion DA of the first substrate 200. When the color filter 350 is present, the first organic light emitting diode OLED1 may emit white light, but is not limited hereto.

The first driving transistor DR1 and the first organic light emitting diode OLED1 are disposed in the circuit portion DA and the light emitting portion EA emits the light. The first driving transistor DR1 and the first organic light emitting diode OLED1 are not disposed in the first transmission portion TA1 so that the light is transmitted. The first organic layer 310 and the upper electrode 320 of the first organic light emitting diode OLED1 do not affect the transmission of light. Thus, the circuit portion DA may also be a non-transmission portion.

On the other hand, a second driving transistor DR2 and a second organic light emitting diode OLED2 are disposed on the rear surface of the first substrate 200.

Specifically, a second buffer layer 405 is disposed below the first substrate 200 and a second semiconductor layer 410 is disposed below the second buffer layer 405. A second gate insulating layer 415 is disposed below the second semiconductor layer 410 and a second gate electrode 420 is disposed below the second gate insulating layer 415 at a position corresponding to a channel of the second semiconductor layer 410. A second capacitor lower electrode 425 is disposed in a region spaced apart from the second gate electrode 420.

A second lower interlayer insulating layer 430 is disposed below the second gate electrode 420 and the second capacitor lower electrode 425 and a second capacitor upper electrode 435 is disposed below the second lower interlayer insulating layer 430. Accordingly, the second capacitor lower electrode 425 and the second capacitor upper electrode 435 constitute a second capacitor Cst2. A second upper interlayer insulating layer 440 is disposed below the second lower interlayer insulating layer 430 to insulate the second capacitor upper electrode 435. The second gate insulating layer 415, the second lower interlayer insulating layer 430, and the second upper interlayer insulating layer 440 are formed with second contact holes 437 exposing the second semiconductor layer 410.

A second drain electrode 450 and a second source electrode 455 are disposed below the second upper interlayer insulating layer 440. The second drain electrode 450 and the second source electrode 455 are connected to the second semiconductor layer 410 through the second contact holes 437, respectively. Accordingly, a second driving transistor DR1 including the second semiconductor layer 410, the second gate electrode 420, the second drain electrode 450 and the second source electrode 455 is constituted.

A second passivation layer 460 is disposed below the first substrate 200 including the second driving transistor DR2 and a second overcoat layer 470 is disposed below the second passivation layer 460. A second via hole 474 is disposed in the second overcoat layer 470 and the second passivation layer 460 to expose the second source electrode 455 of the second driving transistor DR2.

The second organic light emitting diode OLED2 is disposed below the second overcoat layer 470. More specifically, a second lower electrode 480 is disposed below the second overcoat layer 470 in which the second via hole 474 is formed. The second lower electrode 480 serves as a pixel electrode and is electrically connected to the second source electrode 455 of the second driving transistor DR2 through the second via hole 474. The second lower electrode 480 as an anode may be formed of a transparent conductive material such as indium tin oxide (ITO), indium zinc oxide (IZO), or zinc oxide (ZnO). Since the second organic light emitting diode OLED2 has a bottom emission structure, the second lower electrode 480 may be a transparent electrode or a transmissive electrode. Further, the second lower electrode 480 is disposed in the first transmission portion TA1.

A second bank layer 490 for partitioning the pixels is disposed below the second overcoat layer 470 on which the second lower electrode 480 is formed. In the second bank layer 490, a second opening 495 for exposing the second lower electrode 480 is disposed.

A second organic layer 510 is disposed below the first substrate 200 on which the second bank layer 490 is formed. The second organic layer 510 may be formed on the entire surface of the first substrate 200 to be in contact with the second lower electrode 480 through the second opening 495 of the second bank layer 490. The second organic layer 410 may include at least one light emitting layer which emits light by combining electrons and holes and may include at least one selected from a hole injection layer, a hole transport layer, an electron transport layer, and an electron injection layer.

A second upper electrode 520 is disposed below the second organic layer 510. The second upper electrode 520 may be disposed on the entire surface of the first substrate 200 and may be a cathode electrode. The second upper electrode 520 may be formed of magnesium (Mg), calcium (Ca), aluminum (Al), silver (Ag), or an alloy thereof. The second upper electrode 520 may be a reflective electrode capable of reflecting light. The second upper electrode 520 may also be a semi-transmissive and semi-reflective electrode capable of reflecting and transmitting light. Accordingly, the second organic light emitting diode OLED2 including the second lower electrode 480, the second organic layer 510, and the second upper electrode 520 is constituted.

A second encapsulation layer 530 is disposed below the second organic light emitting diode OLED2. The second encapsulation layer 530 may be formed by an organic layer, an inorganic layer, or a single layer or multilayer structure thereof to protect the second organic light emitting diode OLED2 on the second encapsulation layer. A protective film 540 is disposed below the second encapsulation layer 530 to protect the upper components.

The second driving transistor DR2 is disposed in the circuit portion DA and the light emitting portion EA of the second organic light emitting diode OLED2 is disposed in the first transmission portion TA1. Since the second organic light emitting diode OLED2 is a bottom emission structure, the light emitted from the second light emitting diode OLED2 is emitted from the first transmission portion TA1 to be emitted to the second substrate 340 through the first substrate 200. Thus, the second driving transistor DR2 and the second organic light emitting diode OLED2 may be disposed on another surface, for example, a rear surface of the first substrate 200 in the transmission portion TA. The second driving transistor DR2 may overlap with the first driving transistor DR1 in a vertical direction. Also, since the first organic light emitting diode OLED1 is disposed in the circuit portion DA, and the second organic light emitting diode OLED2 is disposed in the transmission portion TA, the second light emitting diode OLED2 may not overlap with the first organic light emitting diode OLED1 in a vertical direction.

Therefore, in the organic light emitting display device according to the exemplary embodiment of the present disclosure described above, the light emitted from the first organic light emitting diode OLED1 is emitted in a direction of the second substrate 340 and the light emitted from the second organic light emitting diode OLED2 may be emitted from the first transmitting portion TA1. In addition, although organic light emitting diodes are described herein as an example, it is appreciated that the display device may include other types of light emitting elements other than organic light emitting diodes OLED1, OLED2. For example, the display device may include a first light emitting element in place of the organic light emitting diode OLED1 and a second light emitting element in place of the organic light emitting diode OLED2, such as a micro LED, LCD, and the like.

The organic light emitting display device of the present disclosure may implement a transparent mode and a non-transparent mode. Referring to FIG. 14 together with FIG. 12 described above, the first organic light emitting diode OLED1 is disposed in the light emitting portion EA of the first sub-pixel SPn1 on the front surface of the first substrate. The first organic light emitting diode OLED1 emits blue B light. On the rear surface of the first substrate, the second organic light emitting diode OLED2 is disposed in the first transmission portion TA1 of the first sub-pixel SPn1. The second organic light emitting diode OLED2 transmits light without emitting light. Therefore, the organic light emitting display device may implement a transparent mode in which the light emitting portion EA of the first sub-pixel SPn1 emits blue B light and the first transmission portion TA1 transmits the light.

Referring to FIG. 14 together with FIG. 13, the first organic light emitting diode OLED1 may emit blue B light and the second organic light emitting diode OLED2 may emit green G light. Therefore, the organic light emitting display device may implement a non-transparent mode in which the light emitting portion EA of the first sub-pixel SPn1 emits blue B light and the first transmission portion TA1 transmits the green G light.

In the organic light emitting display device of Comparative Example illustrated in FIGS. 4 and 5 described above, red, green, and blue colors need to be formed in the organic light emitting diode formed in each sub-pixel, respectively. Specifically, a light emitting material that emits red light is deposited on a red sub-pixel using a first fine metal mask (FMM), a light emitting material that emits green light is deposited on a green sub-pixel using a second FMM, and a light emitting material that emits blue light is deposited on a blue sub-pixel using a third FMM. That is, because of the three-light emitting material deposition processes using three FMMs, a dead zone is generated between the light emitting portions of each sub-pixel due to a mask tolerance. Due to this dead zone, a width of the bank layer defining the light emitting portion between sub-pixels needs to be increased.

On the other hand, in the organic light emitting display device of Embodiments illustrated in FIGS. 12 to 14 described above, since the second organic light emitting diode formed on the rear surface of the first substrate emits the same color, an open metal mask (OMM) may be used instead of the fine metal mask (FMM). The light emitting material is deposited on the entire display portion, so that no dead zone is generated between the light emitting portions of sub-pixels of the second organic light emitting diode. Therefore, the width of the bank layer between sub-pixels formed on the rear surface of the first substrate may be minimized enough to define the light emitting portion. In one instance, the first organic light emitting diodes OLED1 of the plurality of sub-pixels may be configured to emit at least two colors of light from red, blue, and green light, and the second organic light emitting diodes OLED2 of the plurality of sub-pixels may be configured to emit one remaining color of light from the red, green, and blue light that does not correspond to the at least two colors emitted by the first organic light emitting diodes OLED1. In one instance, the first organic light emitting diodes OLED1 may emit red and blue light, and the second organic light emitting diodes OLED2 may emit green light.

Figure 15:
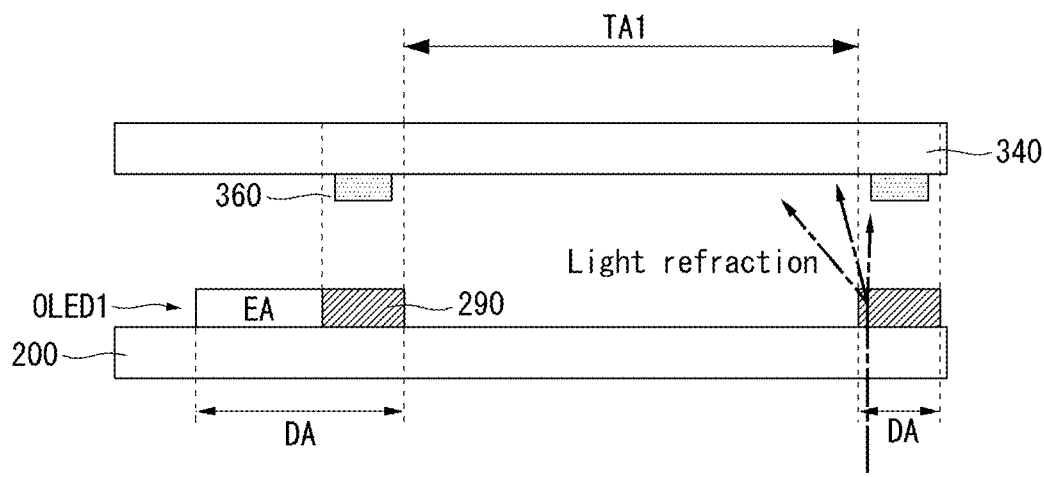
FIG. 15 is a cross-sectional view schematically illustrating an organic light emitting display device according to Comparative Example.
Figure 16:
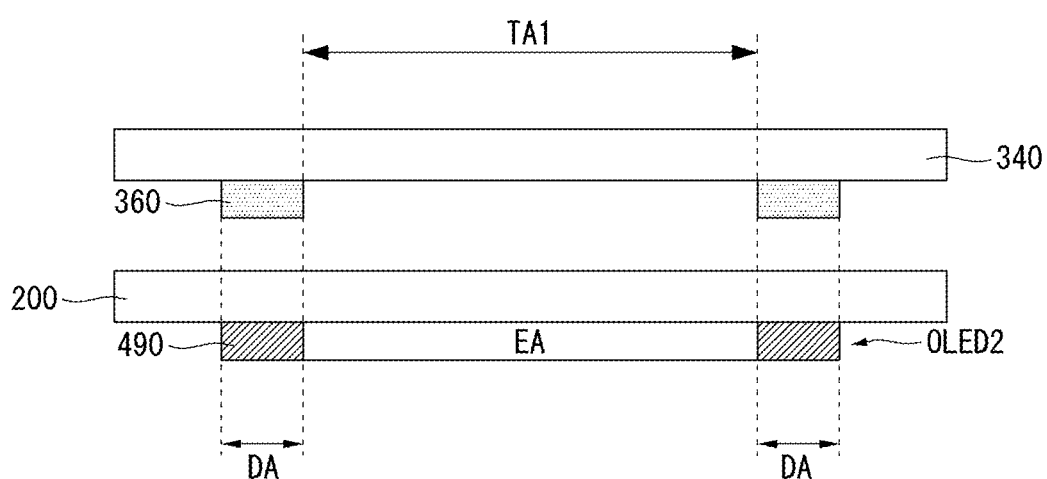
FIG. 16 is a cross-sectional view schematically illustrating an organic light emitting display device according to an Embodiment.
Figures 17, 18:
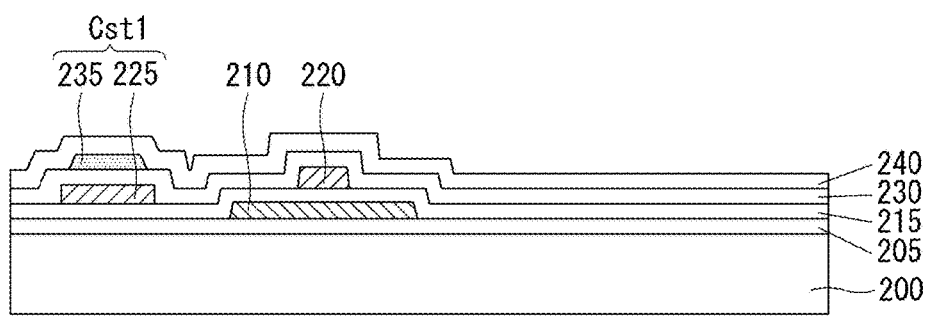
FIG. 17 is a table illustrating a haze and color purity of transmission portions according to Comparative Example and Embodiment.
FIGS. 18 to 21 are cross-sectional views illustrating a manufacturing method of an organic light emitting display device according to an exemplary embodiment of the present disclosure by each process.

FIG. 15 is a cross-sectional view schematically illustrating an organic light emitting display device according to Comparative Example, FIG. 16 is a cross-sectional view schematically illustrating an organic light emitting display device according to Embodiment, and FIG. 17 is a table illustrating a haze and color purity of transmission portions according to Comparative Example and Embodiment.

Referring to FIG. 15, in an organic light emitting display device according to Comparative Example, a circuit portion DA, a first organic light emitting diode OLED1, and a first bank layer 290 are disposed on a front surface of a first substrate 200. A black matrix 360 is disposed on a second substrate 340 in a region corresponding to the circuit portion DA. The first bank layer 290 is formed with a large width to cover the above-described dead zone. Accordingly, the first bank layer 290 is formed to have a larger width than that of the black matrix 360. Accordingly, when external light is incident from the first substrate 200 in a first transmission portion TA1, light is refracted and scattered while passing through the first bank layer 290 overlapping with the first transmission portion TA1. Therefore, the haze of the transmitted light is high and the color purity is low.

Referring to FIG. 16, in an organic light emitting display device according to Embodiment, a circuit portion DA, a second organic light emitting diode OLED2, and a second bank layer 490 are disposed on a rear surface of a first substrate 200. A black matrix 360 is disposed on a second substrate 340 in a region corresponding to the circuit portion DA. The second bank layer 490 may be formed with a small width because there is no dead zone described above. Accordingly, the width of the second bank layer 490 may be equal to or smaller than that of the black matrix 360. Accordingly, when external light is incident from the first substrate 200 in a first transmission portion TA1, as the light is transmitted to the first transmission portion TA1 as it is, the haze of the transmitted light is low and the color purity is improved.

As illustrated in FIG. 17, the organic light emitting display device manufactured according to Comparative Example exhibits a transmittance of 47%, a haze of 6%, and color purity of 41%. The organic light emitting display device manufactured according to Embodiment exhibits a transmittance of 59%, a haze of 2%, and color purity of 63%. Accordingly, in the organic light emitting display device according to Embodiment of the present disclosure, it can be seen that the transmittance, haze, and color purity characteristics of the transmission portion may be improved by providing the second organic light emitting diode on the rear surface of the first substrate.

Hereinafter, a manufacturing method of the organic light emitting display device according to Embodiment of the present disclosure described above will be described. Hereinafter, the materials for the respective components have been described above and will be omitted.

FIGS. 18 to 21 are cross-sectional views illustrating a manufacturing method of an organic light emitting display device according to an exemplary embodiment of the present disclosure by each process.

Referring to FIG. 18, a first buffer layer 205 is formed on a first substrate 200. A first semiconductor layer 210 is formed on the first buffer layer 205 and a first gate insulating layer 215 is formed on the first semiconductor layer 210 to insulate the first semiconductor layer 210. On the first gate insulating layer 215, a first gate electrode 220 is formed in a region overlapping with the first semiconductor layer 210 and simultaneously, a first capacitor lower electrode 225 is formed in a region spaced apart from the first semiconductor layer 210. A first lower interlayer insulating layer 230 is formed on the first capacitor lower electrode 225 and the first semiconductor layer 210. On the first lower interlayer insulating film 230, a first capacitor upper electrode 235 is formed in a region overlapping with the first capacitor lower electrode 225 to form a first capacitor Cst1. A first upper interlayer insulating layer 240 is formed on the first substrate 200 on which the first capacitor Cst1 is formed.

Figure 19:
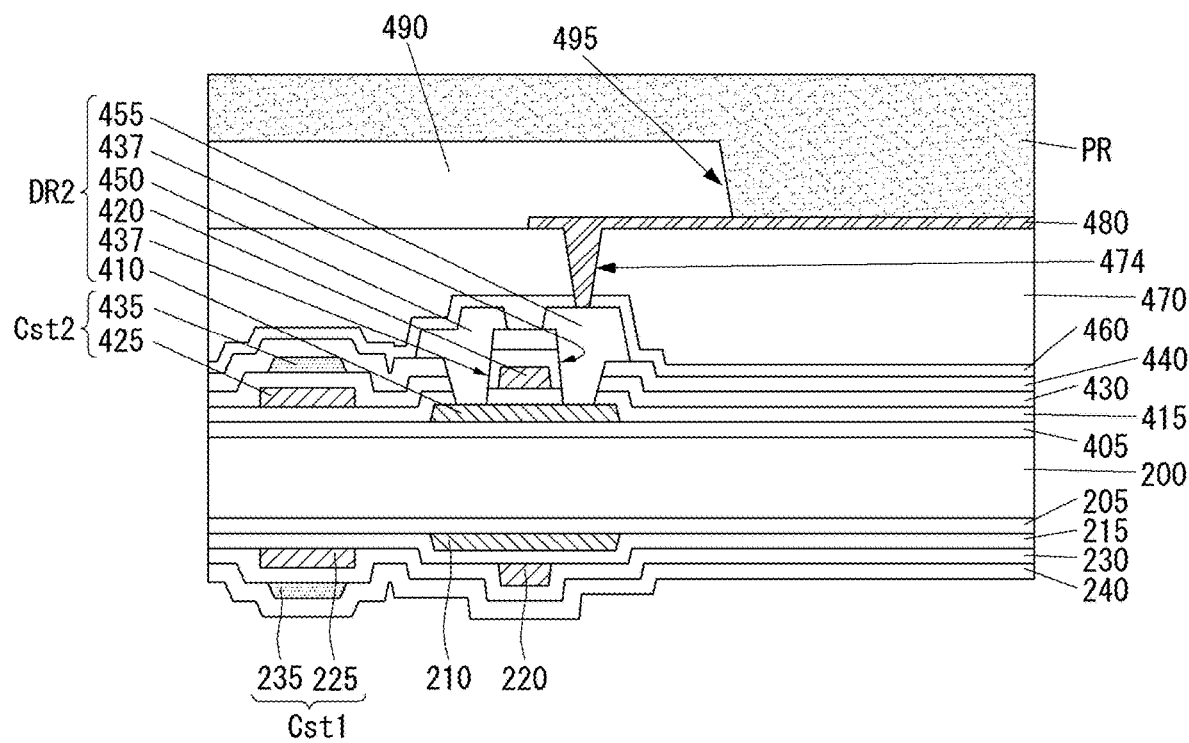

Next, referring to FIG. 19, the first substrate 200 is inverted. A second buffer layer 405 is formed on one surface of the first substrate 200 which is inverted. A second semiconductor layer 410 is formed on the second buffer layer 405 and a second gate insulating layer 415 is formed on the second semiconductor layer 410 to insulate the second semiconductor layer 410. On the second gate insulating layer 415, a second gate electrode 420 is formed in a region overlapping with the second semiconductor layer 410 and simultaneously, a second capacitor lower electrode 425 is formed in a region spaced apart from the second semiconductor layer 410. A second lower interlayer insulating layer 430 is formed on the second capacitor lower electrode 425 and the second semiconductor layer 410. On the second lower interlayer insulating film 430, a second capacitor upper electrode 435 is formed in a region overlapping with the second capacitor lower electrode 425 to form a second capacitor Cst2. A second upper interlayer insulating layer 440 is formed on the first substrate 200 on which the second capacitor Cst2 is formed.

The second gate insulating layer 415, the second lower interlayer insulating layer 430, and the second upper interlayer insulating layer 440 are formed with second contact holes 437 exposing the second semiconductor layer 410. A second drain electrode 450 and a second source electrode 455 are disposed on the second upper interlayer insulating layer 440. The second drain electrode 450 and the second source electrode 455 are contacted and connected with the second semiconductor layer 410 through the second contact holes 437, respectively. Accordingly, a second driving transistor DR2 including the second semiconductor layer 410, the second gate electrode 420, the second drain electrode 450 and the second source electrode 455 is manufactured.

A second passivation layer 460 is formed on the second driving transistor DR2 and a second overcoat layer 470 is formed on the second passivation layer 460. A second via hole 474 is formed in the second passivation layer 460 and the second overcoat layer 470 to expose the second source electrode 455. A second lower electrode 480 is formed on the second overcoat layer 470. The second lower electrode 480 is contacted and connected with the second source electrode 455 through the second via hole 474. Next, a second bank layer 490 is formed on the first substrate 200 on which the second lower electrode 480 is formed. In the second bank layer 490, a second opening 495 for exposing the second lower electrode 480 below the second bank layer is disposed. A photoresist PR serving as a protective film is coated on the second bank layer 490 to protect the first substrate 200 on which the second bank layer 490 is formed.

Figure 20:
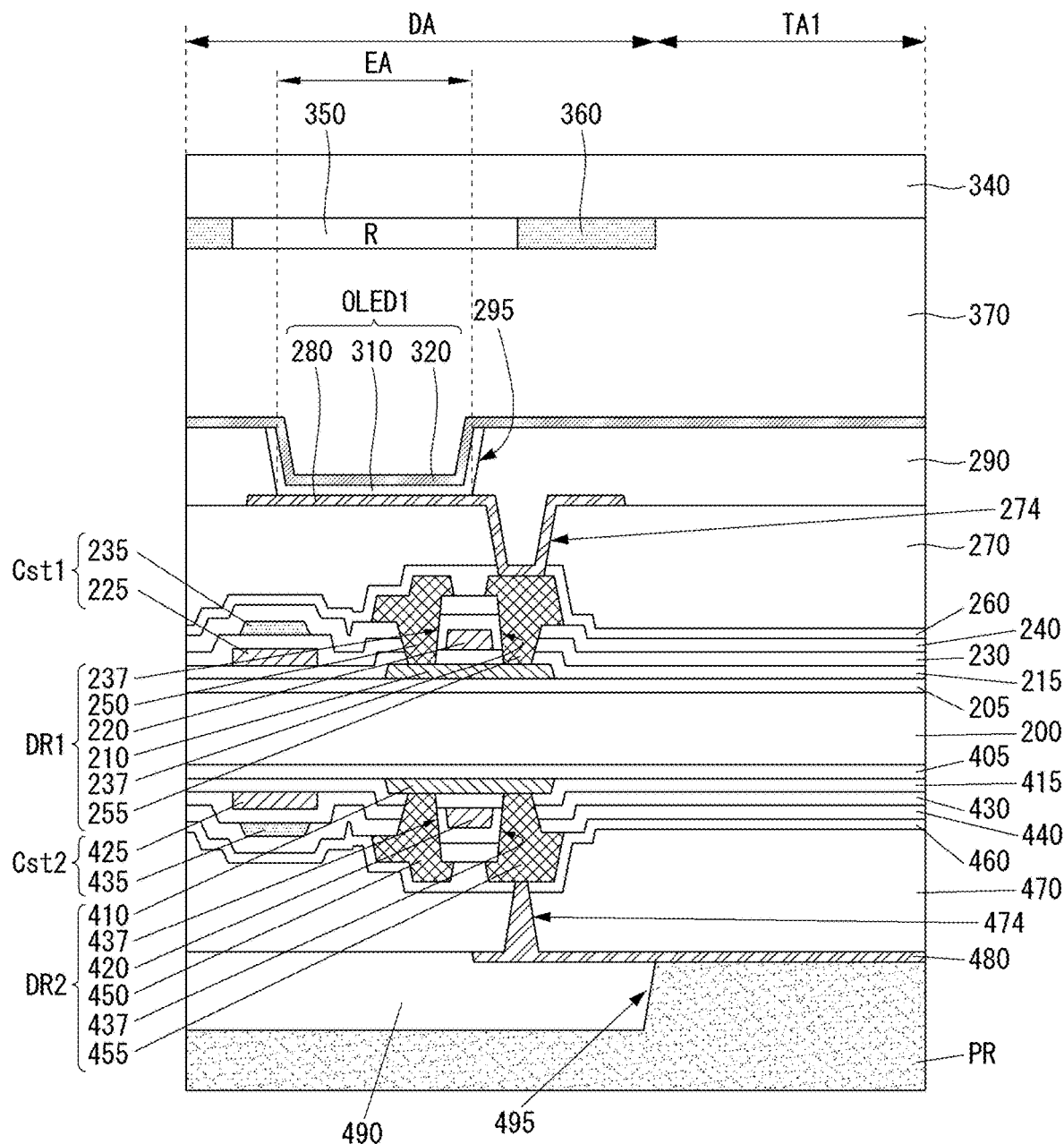

Next, referring to FIG. 20, the first substrate 200 is inverted again. The first gate insulating layer 215, the first lower interlayer insulating layer 230, and the first upper interlayer insulating layer 240 which are formed above are formed with first contact holes 237 exposing the first semiconductor layer 210. A first drain electrode 250 and a first source electrode 255 are disposed on the first upper interlayer insulating layer 240. The first drain electrode 250 and the first source electrode 255 are contacted and connected with the first semiconductor layer 210 through the first contact holes 237, respectively. Accordingly, a first driving transistor DR1 including the first semiconductor layer 210, the first gate electrode 220, the first drain electrode 250 and the first source electrode 255 is manufactured.

A first passivation layer 260 is formed on the first driving transistor DR1 and a first overcoat layer 270 is formed on the first passivation layer 260. A first via hole 274 is formed in the first passivation layer 260 and the first overcoat layer 270 to expose the first source electrode 255. A first lower electrode 280 is formed on the first overcoat layer 270. The first lower electrode 280 is contacted and connected with the first source electrode 255 through the first via hole 274. Next, a first bank layer 290 is formed on the first substrate 200 on which the first lower electrode 280 is formed. In the first bank layer 290, a first opening 295 for exposing the first lower electrode 280 below the first bank layer is formed. A light emitting material is deposited on the first bank layer 290 using a fine metal mask to form a first organic layer 310. A first upper electrode 320 is formed on the first substrate 200 on which the first organic layer 310 is formed to form a first organic light emitting diode OLED1 including the first lower electrode 280, the first organic layer 310 and the first upper electrode 320. A first encapsulation layer 370 is formed on the first substrate 200 including a first organic light emitting diode OLED1.

Next, a color filter 350 and a black matrix 360 are formed on one surface of a second substrate 340 facing the first organic light emitting diode OLED1. At this time, the color filter 350 is disposed to correspond to a light emitting portion EA of the first organic light emitting diode OLED1. In addition, the black matrix 360 is disposed in a circuit portion DA excluding the light emitting portion EA and the first transmission portion TA1. Next, the first organic light emitting diode OLED1 of the first substrate 200 and the color filter 350 of the second substrate 340 are aligned so as to face each other and bonded to each other.

Figure 21:
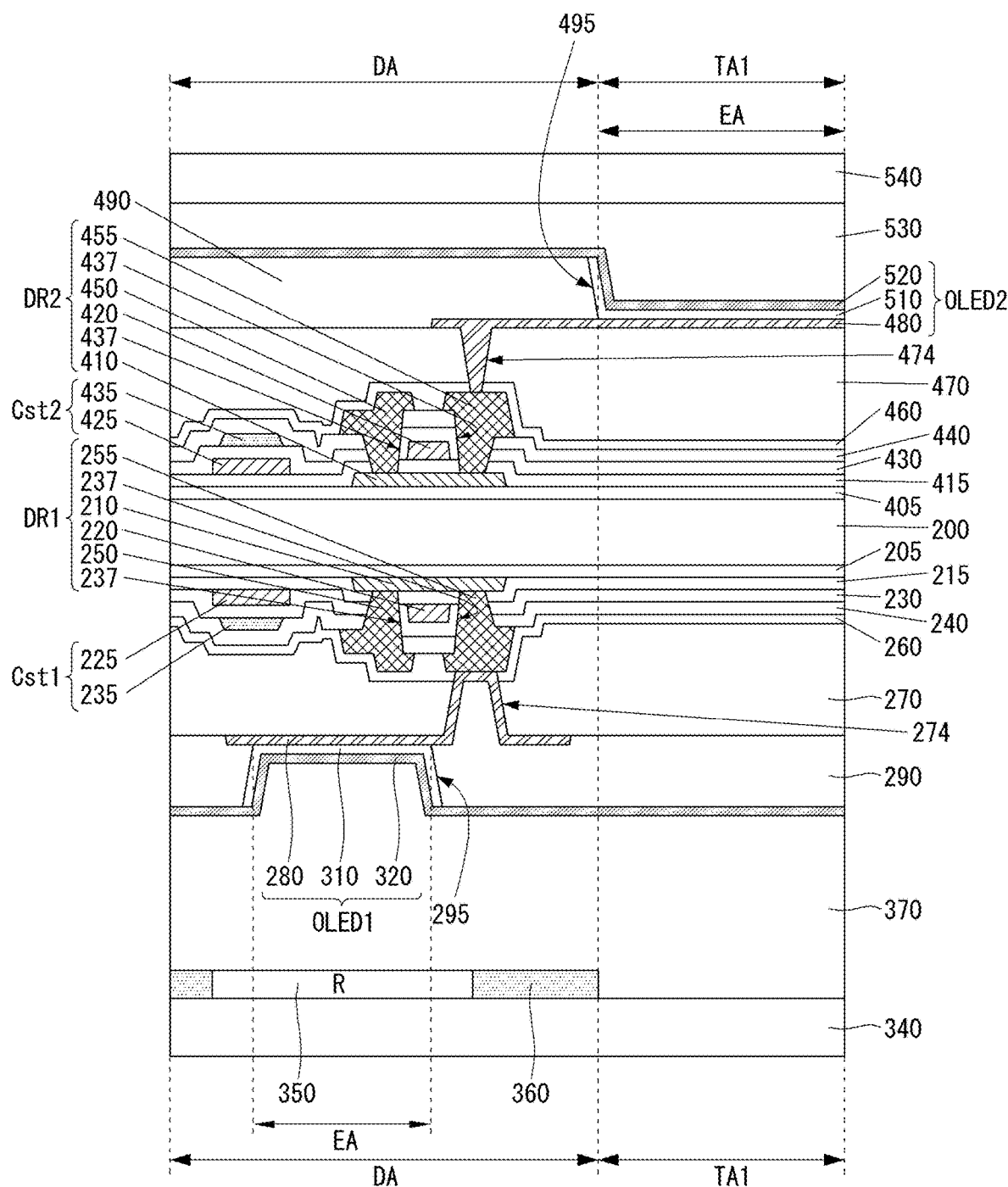

Next, referring to FIG. 21, the first substrate 200 is inverted again. The photoresist PR formed on the second bank layer 490 is removed. In addition, a light emitting material is deposited on the first substrate 200 on which the second bank layer 490 is formed by using an open metal mask to form a second organic layer 510. The first organic layer 310 described above is deposited on each sub-pixel in a pattern shape using a fine metal mask, but the second organic layer 510 is continuously deposited on the entire surface of the second bank layer 490. The second organic layer 510 is formed of a light emitting material that exhibits the same color in each sub-pixel. A second upper electrode 520 is formed on the second organic layer 510. Accordingly, a second organic light emitting diode OLED2 including the second lower electrode 480, the second organic layer 510, and the second upper electrode 520 is formed.

A second encapsulation layer 530 is formed on the second substrate 200 on which the second organic light emitting diode OLED2 is formed and a protective film 540 is attached on the second encapsulation layer 530, thereby manufacturing the organic light emitting display device according to the exemplary embodiment.

In the organic light emitting display device of the present invention described above, the first driving transistor and the first organic light emitting diode are formed on one surface of the first substrate by inverting the first substrate three times, and the second driving transistor and the second organic light emitting diode are formed on the other surface of the first substrate. The first organic layer of the first organic light emitting diode may be formed using the fine metal mask and the second organic layer of the second organic light emitting diode may be formed using the open metal mask.

As described above, in the organic light emitting display device according to the exemplary embodiment of the present disclosure, the second organic light emitting diode is further formed on the rear surface of the first substrate and the transmission portion also emits the light, thereby improving an aperture ratio. Further, in the organic light emitting display device according to the exemplary embodiment of the present disclosure, the width of the bank layer formed on the second organic light emitting diode is equal to or smaller than that of the black matrix, thereby improving transmittance, haze, and color purity characteristics in the transmission portion.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising a plurality of sub-pixels, each sub-pixel comprising:
   at least a part of a first substrate, the part of the first substrate including a circuit portion and a transmission portion adjacent the circuit portion, the transmission portion configured to transmit light;
   a first light emitting element disposed over one surface of the first substrate in the circuit portion;
   a first driving transistor on the one surface of the first substrate in the circuit portion, the first driving transistor electrically connected to the first light emitting element;
   a second light emitting element disposed over another surface of the first substrate in the transmission portion; and
   a second driving transistor on the another surface of the first substrate, the second driving transistor electrically connected to the second light emitting element.

2. The display device of claim 1, wherein the second driving transistor is further disposed in the circuit portion, and wherein the first driving transistor and the second driving transistor overlap with each other with the first substrate interposed between.

3. The display device of claim 1, wherein the first light emitting element and the second light emitting element do not overlap in a vertical direction.

4. The display device of claim 1, wherein the first light emitting element includes a first lower electrode, disposed on the one surface of the first substrate in the circuit portion, a first organic layer disposed on the first lower electrode, and a first upper electrode disposed on the first organic layer, and
   wherein the second light emitting element includes a second lower electrode disposed on the another surface of the first substrate in the transmission portion, a second organic layer disposed on the second lower electrode, and a second upper electrode disposed on the second organic layer.

5. The display device of claim 4, wherein the first lower electrode is a reflection electrode and the second lower electrode is a transmission electrode.

6. The display device of claim 4, further comprising a first bank layer on at least a portion of the first lower electrode and a second bank layer on at least a portion of the second lower electrode.

7. The display device of claim 6, further comprising:
   a second substrate disposed above the one surface of the first substrate; and
   a black matrix disposed on one surface of the second substrate facing the first substrate, wherein the first bank layer has a width larger than a width of the black matrix and the second bank layer has a width equal to or smaller than the width of the black matrix.

8. The display device of claim 1, wherein the first light emitting elements of the plurality of sub-pixels is configured to emit at least two colors of light from red, green, and blue light, and the second light emitting elements of the plurality of sub-pixels is configured to emit one remaining color of light from red, green, and blue light that does not correspond to the at least two colors of light emitted from the first light emitting elements of the plurality of sub-pixels.

9. The display device of claim 8, wherein the second light emitting elements of the plurality of sub-pixels emit a single color of light.

10. The display device of claim 1, further comprising:
    a first pad portion disposed over a first side of the first substrate on the one surface of the first substrate;
    a first printed circuit board electrically connected to the first pad portion;
    a second pad portion disposed over the first side of the first substrate on the another surface of the first substrate; and
    a second printed circuit board electrically connected to the second pad portion.

11. The display device of claim 1, further comprising:
    a first pad portion disposed over a first side of the first substrate on the one surface of the first substrate;
    a first printed circuit board electrically connected to the first pad portion;
    a second pad portion disposed over a second side of the first substrate opposite the first side on the another surface of the first substrate; and
    a second printed circuit board electrically connected to the second pad portion.

12. A display device comprising a plurality of sub-pixels, each sub-pixel comprising:
    at least a part of a first substrate, the part of the first substrate including a non-transmission portion and a transmission portion adjacent the non-transmission portion;
    a first light emitting element disposed on one surface of the first substrate in the non-transmission portion;
    a second light emitting element disposed on another surface of the first substrate in the transmission portion;
    a first driving transistor on the one surface of the first substrate in the non-transmission portion, the first driving transistor electrically connected to the first light emitting element; and
    a second driving transistor on the another surface of the first substrate in the non-transmission portion, the second driving transistor electrically connected to the second light emitting element.

13. The display device of claim 12, wherein the first light emitting element and the second light emitting element do not overlap in a vertical direction.

14. The display device of claim 12, wherein the transmission portion of the first substrate is configured to transmit light.

15. The display device of claim 12, wherein the first driving transistor and the second driving transistor overlap with each other with the first substrate interposed between.

16. The display device of claim 12, wherein the first light emitting elements of the plurality of sub-pixels is configured to emit at least two colors of light from red, green, and blue light, and the second light emitting elements of the plurality of sub-pixels is configured to emit one remaining color of light from red, green, and blue light that does not correspond to the at least two colors of light emitted from the first light emitting elements of the plurality of sub-pixels.

17. The display device of claim 16, wherein the second light emitting elements of the plurality of sub-pixels emit a single color of light.

* * * * *